US011864390B2

United States Patent
Sato

(10) Patent No.: US 11,864,390 B2
(45) Date of Patent: Jan. 2, 2024

(54) SEMICONDUCTOR MEMORY DEVICE

(71) Applicant: Kioxia Corporation, Tokyo (JP)

(72) Inventor: Jumpei Sato, Kawasaki Kanagawa (JP)

(73) Assignee: Kioxia Corporation, Tokyo (JP)

( * ) Notice: Subject to any disclaimer, the term of this patent is extended or adjusted under 35 U.S.C. 154(b) by 364 days.

(21) Appl. No.: 17/017,721

(22) Filed: Sep. 11, 2020

(65) Prior Publication Data

US 2021/0305268 A1    Sep. 30, 2021

(30) Foreign Application Priority Data

Mar. 24, 2020 (JP) .................. 2020-052216

(51) Int. Cl.
| | |
|---|---|
| H01L 27/11573 | (2017.01) |
| H10B 43/40 | (2023.01) |
| G11C 16/08 | (2006.01) |
| G11C 16/30 | (2006.01) |
| G11C 16/24 | (2006.01) |
| H10B 43/20 | (2023.01) |
| H10B 43/35 | (2023.01) |

(52) U.S. Cl.
CPC ............. *H10B 43/40* (2023.02); *G11C 16/08* (2013.01); *G11C 16/24* (2013.01); *G11C 16/30* (2013.01); *H10B 43/20* (2023.02); *H10B 43/35* (2023.02)

(58) Field of Classification Search
CPC ......... H01L 27/11573; H01L 27/11578; H01L 27/1157; H01L 27/11582; G11C 16/26; G11C 16/0483; G11C 16/30; G11C 16/24; G11C 16/08

USPC .......................................... 257/314
See application file for complete search history.

(56) References Cited

U.S. PATENT DOCUMENTS

| | | | | |
|---|---|---|---|---|
| 7,898,895 | B2* | 3/2011 | Kajigaya | G11C 7/1075 |
| | | | | 365/207 |
| 9,639,649 | B2 | 5/2017 | Etou et al. | |
| 10,622,033 | B2 | 4/2020 | Sato | |
| 2002/0006054 | A1* | 1/2002 | Shukuri | H01L 27/11526 |
| | | | | 365/145 |
| 2005/0174866 | A1* | 8/2005 | Wada | G11C 11/4091 |
| | | | | 365/205 |
| 2009/0267128 | A1 | 10/2009 | Maejima | |
| 2009/0268522 | A1 | 10/2009 | Maejima | |
| 2010/0207195 | A1 | 8/2010 | Fukuzumi et al. | |
| 2011/0228583 | A1* | 9/2011 | Noguchi | G11C 5/025 |
| | | | | 365/63 |
| 2011/0284946 | A1 | 11/2011 | Kiyotoshi | |
| 2014/0063964 | A1* | 3/2014 | Futatsuyama | G11C 16/26 |
| | | | | 365/185.05 |

(Continued)

Primary Examiner — Hrayr A Sayadian
(74) Attorney, Agent, or Firm — Holtz, Holtz & Volek PC

(57) ABSTRACT

According to one embodiment, a semiconductor memory device includes the following structure. A memory array is provided on a first-direction side of a substrate. The first direction intersects the substrate. The first peripheral circuit is provided between the substrate and the memory array. The second peripheral circuit is provided between the substrate and the memory array and on a second-direction side of the first peripheral circuit. The second direction intersects the first direction. The sense amplifier is provided between the substrate and the memory array and between the first and second peripheral circuits. A second-direction length of the second peripheral circuit is smaller than half a second-direction length of the sense amplifier.

13 Claims, 8 Drawing Sheets

(56) References Cited

U.S. PATENT DOCUMENTS

| | | |
|---|---|---|
| 2018/0233185 A1 | 8/2018 | Futatsuyama |
| 2019/0043874 A1 | 2/2019 | Thimmegowda et al. |
| 2019/0103139 A1 | 4/2019 | Laurent |
| 2019/0164991 A1 | 5/2019 | Lim et al. |

* cited by examiner

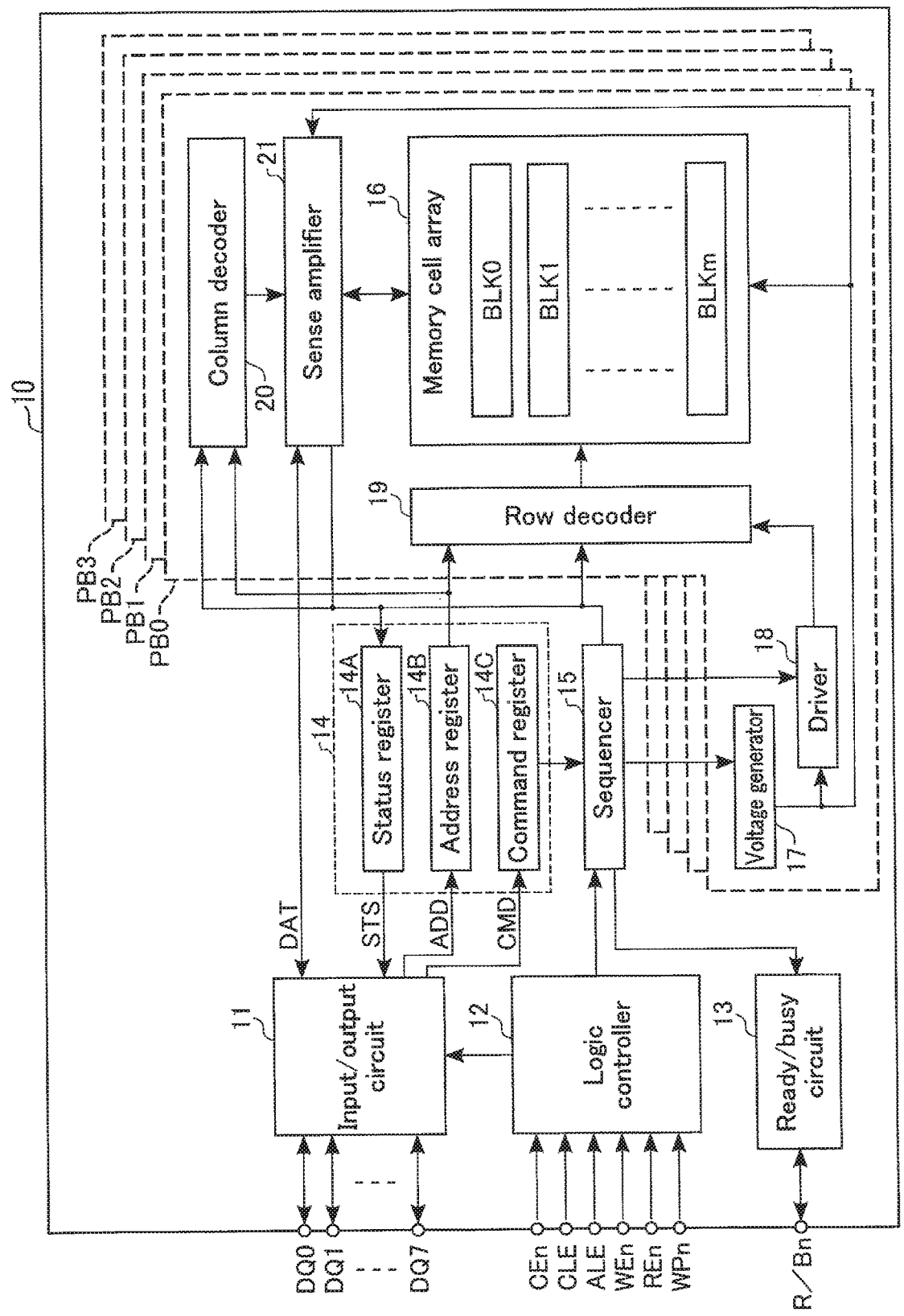
F I G. 1

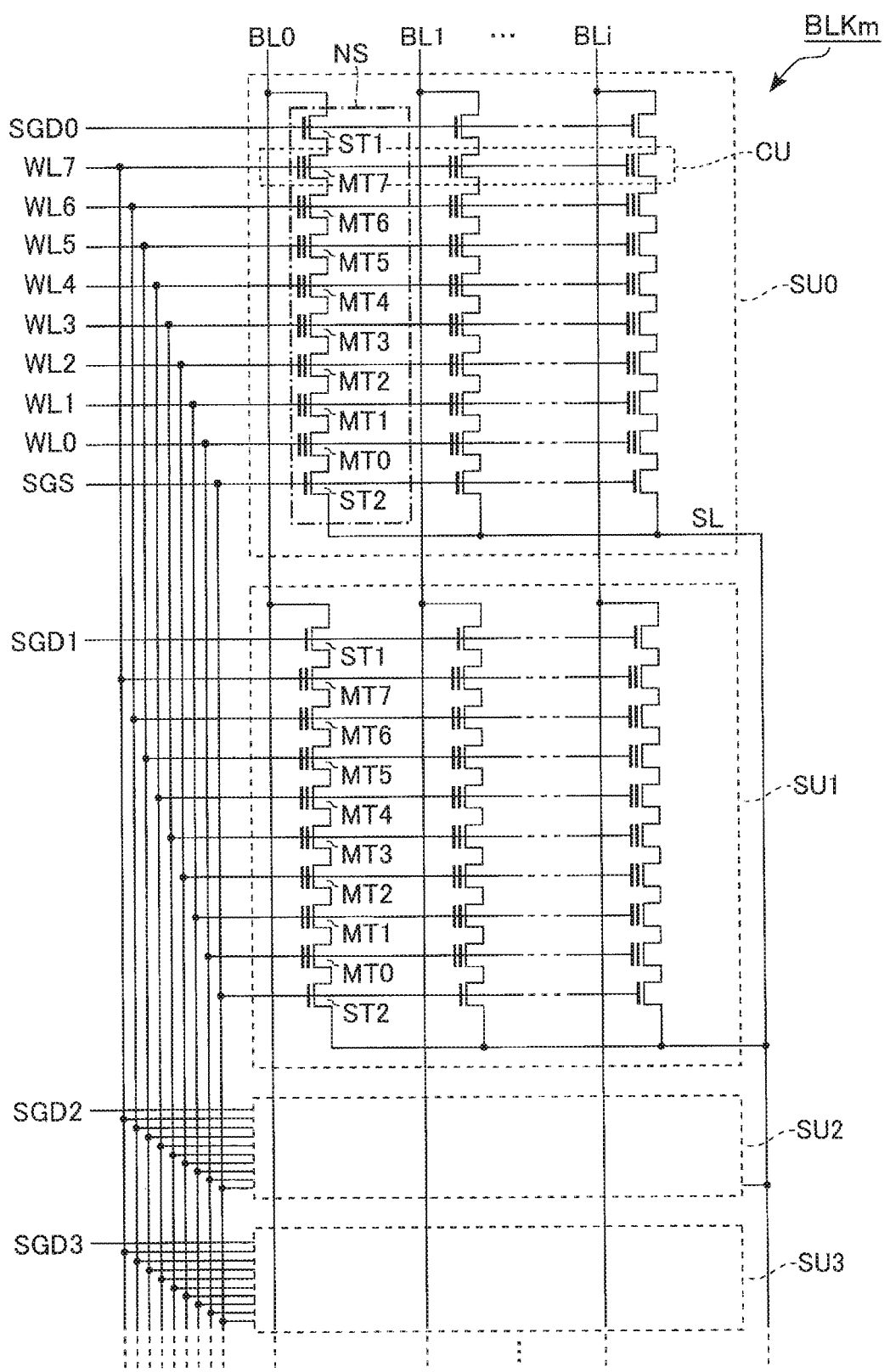
F I G. 2

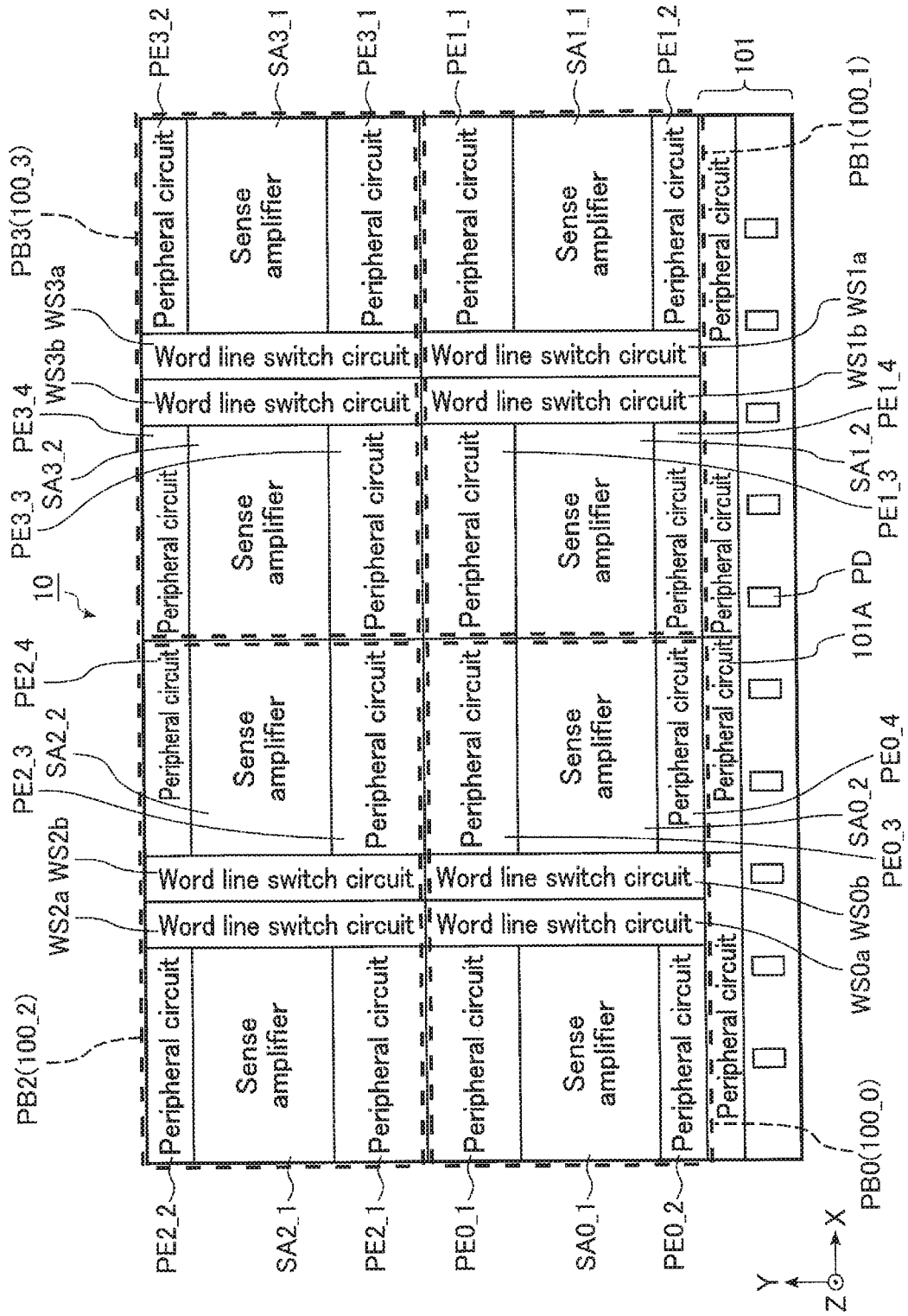
F I G. 5

F.I.G. 7

SEMICONDUCTOR MEMORY DEVICE

CROSS-REFERENCE TO RELATED APPLICATIONS

This application is based upon and claims the benefit of priority from the Japanese Patent Application No. 2020-052216, filed Mar. 24, 2020, the entire contents of which are incorporated herein by reference.

FIELD

Embodiments described herein relate generally to a semiconductor memory device.

BACKGROUND

A semiconductor memory device in which memory cells are three-dimensionally arranged is known.

BRIEF DESCRIPTION OF THE DRAWINGS

FIG. 1 is a block diagram showing a circuit configuration of a semiconductor memory device of an embodiment.

FIG. 2 is a circuit diagram of a block in a memory cell array in the embodiment.

FIG. 5 is a diagram showing an outline of the planar layout of peripheral circuit regions in the embodiment.

DETAILED DESCRIPTION

Figure 3:
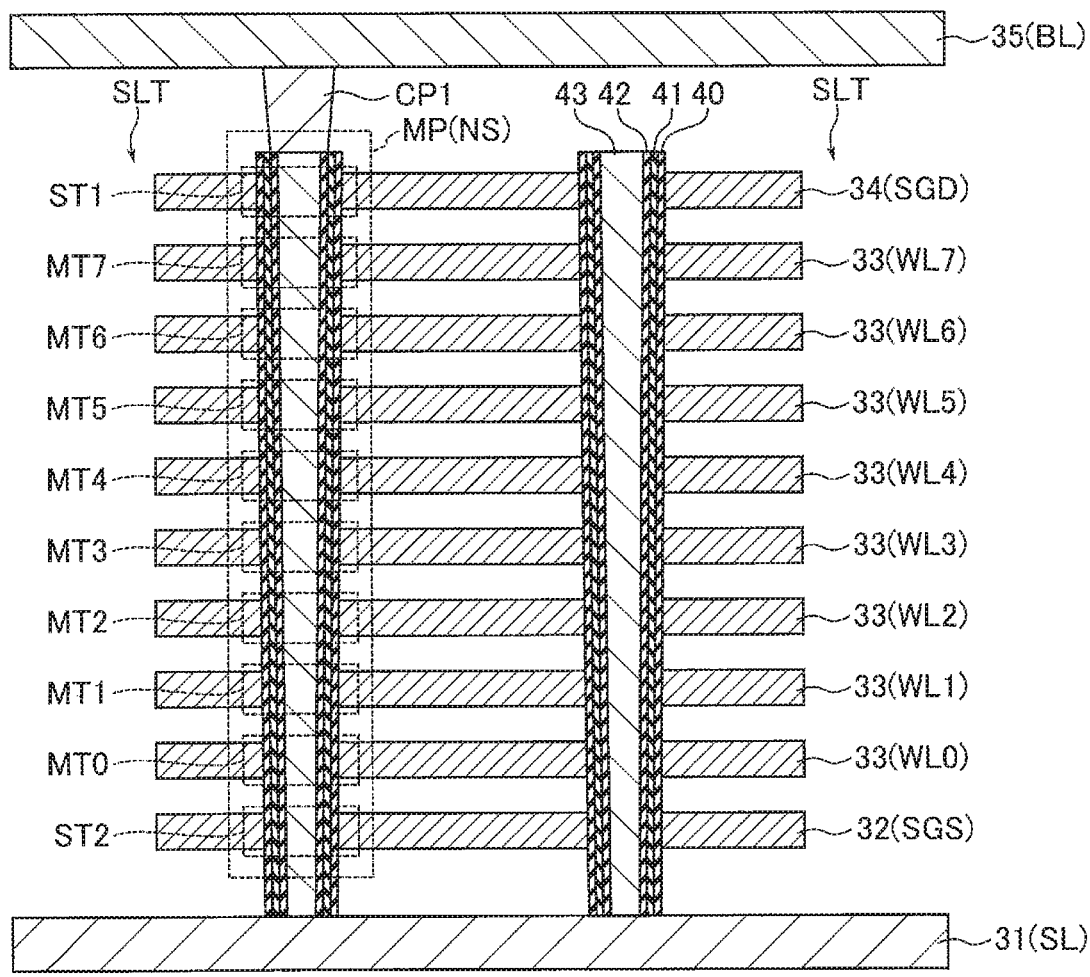
FIG. 3 is a cross-sectional view of a memory cell transistor in the memory cell array in the embodiment.

In general, according to one embodiment, a semiconductor memory device includes: a memory cell array provided on a first-direction side of a substrate and including a plurality of memory cells, the first direction intersecting the substrate; a first peripheral circuit provided between the substrate and the memory cell array; a second peripheral circuit provided between the substrate and the memory cell array and on a second-direction side of the first peripheral circuit apart from the first peripheral circuit, the second direction intersecting the first direction; and a sense amplifier provided between the substrate and the memory cell array and between the first peripheral circuit and the second peripheral circuit. A second-direction length of the second peripheral circuit is smaller than half a second-direction length of the sense amplifier.

Hereinafter, an embodiment will be described with reference to the accompanying drawings. In the description below, constituent elements having the same function and configuration will be assigned a common reference symbol. The embodiment described below merely indicates an exemplary apparatus or method for implementing the technical idea of the embodiment. The materials, shapes, structures, arrangements, etc. of the components are not limited to the ones described below.

Each of the function blocks can be implemented in the form of hardware, computer software, or a combination thereof. The function blocks are not necessarily separated as in the following examples. For example, function may be partly executed by a function block different from the function block described as an example. In addition, the function block described as an example may be divided into smaller function sub-blocks. Hereinafter, a three-dimensionally stacked type NAND flash memory, in which memory cell transistors are stacked above a semiconductor substrate, will be described as an example of the semiconductor memory device. Herein, a memory cell transistor may also be referred to as a "memory cell".

1 Embodiment

The semiconductor memory device of the embodiment is, for example, a NAND flash memory, which can nonvolatilely store data.

1.1 Configuration of Semiconductor Memory Device

Hereinafter, a circuit configuration of the semiconductor memory device of the embodiment will be described. FIG. 1 is a block diagram showing a circuit configuration of the semiconductor memory device of the embodiment.

The semiconductor memory device 10 includes, for example, planes PB0, PB1, PB2, and PB3, an input/output circuit 11, a logic controller 12, a ready/busy circuit 13, a register group 14, and a sequencer (or a control circuit) 15. The register group 14 includes a status register 14A, an address register 14B, and a command register 14C.

Each of the planes PB0 to PB3 includes a memory cell array 16, a voltage generator 17, a driver 18, a row decoder 19, a column decoder 20, and a sense amplifier 21. Each of the planes PB0 to PB3 is a constituent unit capable of executing a read operation independently of the other planes. Each of the planes PB0 to PB3 may be a constituent unit capable of executing a write operation and erase operation independently of the other planes. Hereinafter, a "plane PB" refers to each of the planes PB0 to PB3.

The memory cell array 16 includes one or more blocks BLK0, BLK1, BLK2, . . . , and BLKm (where m is an integer equal to or greater than 0). Each of the blocks BLK0 to BLKm includes a plurality of memory cell transistors (hereinafter also referred to as "memory cells") each associated with a row and a column. The memory cell transistors are nonvolatile memory cells capable of being electrically erased and programmed. The memory cell array 16 includes a plurality f word lines, a plurality of bit lines, and a source line for applying voltages to the memory cell transistors. Hereinafter, a "block BLKm" refers to each of the blocks BLK0 to BLKm. A specific configuration of the block BLKm will be described later.

The input/output circuit 11 and the logic controller 12 are coupled to an external device (not shown), such as a memory controller, via an input/output terminal (or a NAND bus). The input/output circuit 11 transmits and receives an input/output signal DQ (such as DQ0, DQ1, DQ2, . . . , or DQ7) to and from the memory controller via the input/output terminal. The input/output signal DQ communicates a command, an address, data, and the like. The input/output circuit 11 receives a power supply voltage VEXTQ via a power supply terminal (not shown) from outside the semiconductor memory device 10. The power supply voltage VEXTQ is used for input and output of data at the input/output circuit 11.

The logic controller 12 receives an external control signal from the memory controller via the input/output terminal.

The external control signal includes, for example, a chip enable signal CEn, a command latch enable signal CLE, an address latch enable signal. ALE, a write enable signal WEn, a read enable signal REn, and a write protect signal. WPn. The symbol "n" assigned to the name of a signal indicates that the signal is active-low.

The chip enable signal CEn enables selection of the semiconductor memory device 10, and is asserted when selecting the semiconductor memory device 10. The command latch enable signal CLE enables latching a command transmitted as a signal DQ in the command register 14C. The address latch enable signal. ALE enables latching of an address transmitted as a signal DQ in the address register 14B. The write enable signal WEn enables retainment of data transmitted as a signal DQ in the input/output circuit 11. The read enable signal REIN enables output of data read from the memory cell array 16 as a signal DQ. The write protect signal WPn is asserted when prohibiting a write operation and an erase operation on the semiconductor memory device 10.

The ready/busy circuit 13 generates a ready/busy signal R/Bn in response to control by the sequencer 15. The ready/busy signal. R/Bn indicates whether the semiconductor memory device 10 is in a ready state or a busy state. The ready state is a state in which an instruction from the memory controller can be received. The busy state is a state in which an instruction from the memory controller cannot be received. Through reception of the ready/busy signal R/Bn from the semiconductor memory device 10, the memory controller can recognize whether the semiconductor memory device 10 is in the ready state or in the busy state.

The status register 14A retains status information STS required for operations of the semiconductor memory device 10, and transfers the status information STS to the input/output circuit 11 based on an instruction from the sequencer 15. The address register 14B retains an address ADD transferred from the input/output circuit 11. The address ADD includes a row address and a column address. The row address includes, for example, a block address that designates an, operation target block BLKm, and a page address that designates an operation target word line in the designated block. The command register 14C retains a command CMD transferred from the input/output circuit 11. The command CMD includes, for example, a write command that instructs the sequencer 15 to perform a write operation, and a read command that instructs the sequencer 15 to perform a read operation. For example, an SRAM is used for the status register 14A, the address register 14B, and the command register 14C.

The sequencer 15 receives a command from the command register 14C, and collectively controls the semiconductor memory device 10 in accordance with a sequence based on the command. The sequencer 15 controls the row decoder 19, the sense amplifier 21, the voltage generator 17, the driver 18, and the like to execute a write operation, read operation, and an erase operation. Specifically, the sequencer 15 controls the row decoder 19, the driver 18, and the sense amplifier 21 based on a write command received from the command register 14C, and writes data in a plurality of memory cell transistors designated by an address ADD. Also, the sequencer 15 controls the row decoder 19, the driver 18, and the sense amplifier 21 based on a read command received from the command register 14C, and reads data from a plurality of memory cell transistors designated by an address ADD. Also, the sequencer 15 controls the row decoder 19, the driver 18, the column decoder 20, and the sense amplifier 21 based on an erase command received from the command register 14C, and erases data stored in a block designated by an address ADD.

They voltage generator 17 receives a power supply voltage VEXT via a power supply terminal (not shown) from outside the semiconductor memory device 10. The voltage generator 17 uses the power supply voltage VEXT to generate voltages required for a write operation, a read operation, and an erase operation. The voltage generator 17 supplies the generated voltages to the memory cell array 16, the driver 18, the sense amplifier 21, and the like.

The driver 18 receives a plurality of voltages from the voltage generator 17. The driver 18 supplies voltages selected from the voltages supplied from the voltage generator 17 in accordance with whether the operation is a read operation, a write operation, or an erase operation, to the row decoder 19 via a plurality of signal lines.

The row decoder 19 receives a row address from the address register 14B, and decodes the row address. The row decoder 19 selects one of the blocks BLKm, and further selects a word line in the selected block BLKm based on a result of decoding of the row address. The row decoder 19 also transfers the voltages supplied from the driver 18 to the selected block BLKm.

The column decoder 20 receives a column address from the address register 14B, and decodes the column address. The column decoder 20 selects a bit line based on a result of decoding of the column address.

In a data read operation, the sense amplifier 21 detects and amplifies data read from memory cell transistors to the bit line. The sense amplifier 21 then temporarily retains read data DAT read from the memory cell transistors, and transfers the read data DAT to the input/output circuit 11. In a data write operation, the sense amplifier 21 temporarily retains write data DAT transferred from the input/output circuit 11. The sense amplifier 21 also transfers the write data DAT to a bit line.

1.1.1 Circuit Configuration of Memory Cell Array

Next, a circuit configuration of the memory cell array 16 in the semiconductor memory device 10 of the embodiment will be desdribed. The memory cell array 16 includes a plurality of blocks BLK0 to BLKm, as described above. Here, the circuit configuration of one block BLKm is described; however, the other blocks have the same circuit configuration.

FIG. 2 is a circuit diagram of a block BLKm in the memory cell array 16. The block BLKm includes, for example, a plurality of string units SU0, Su1, SU2, and SU3. Described herein as an example is the case where the block BLKm includes string units SU0 to SU3; however, the number of string units included in the block BLKm may be any number. Hereinafter, a "string unit SU" refers to each of the string units SU0 to SU3.

The string unit SU includes a plurality of NAND strings (or memory strings) NS. The number of NAND strings NS included in one string unit SU may be any number.

The NAND strings NS each include a plurality of memory cell transistors MT0, MT1, MT2, . . . , and MT7, and select transistors ST1 and ST2. For simplification of description, the case where each NAND string NS includes eight memory cell transistors MT0 to MT7 and two select transistors ST1 and ST2 is described here; however, the number of memory cell transistors and the number of select transistors in each NAND string NS may be any number. Hereinafter, a"memory cell transistor MT" refers to each of the memory cell transistors MT0 to MT7.

The memory cell transistor MT includes a control gate and a charge storage layer, and nonvolatilely stores data. The memory cell transistors MT are coupled in series between the source of the select transistor ST1 and the drain of the select transistor ST2.

The memory cell transistor MT can store 1-bit data, or 2-or-more-bit data. The memory cell transistor MT may be of a metal-oxide-nitride-oxide-silicon (MONOS) type, which uses an insulating film as the charge storage layer, or of a floating-gate (FG) type, which uses a conductive layer as the charge storage layer.

The gates of the select transistors ST1 included in the string unit SU0 are coupled to a select gate line SGD0. Similarly, the gates of the select transistors ST1 in the string units SU1 to SU3 are coupled to respective select gate lines SGD1 to SGD3. The select gate lines SGD0 to SGD3 are each independently controlled by the row decoder 19.

The gates of the select transistors ST2 included in the string unit SU0 are coupled to a select gate line SGS. Similarly, the gates of the select transistors ST2 in the string units SU1 to SU3 are coupled to the select gate line SGS. The gates of the select transistors ST2 in the string units SU0 to SU3 may be coupled to respective select gate lines SGS. The select transistors ST1 and ST2 are used for selection of a string unit SU in various operations.

The control gates of the memory cell transistors MT0 to MT7 included in the block BLKm are coupled to respective word lines WL0 to WL7. The word lines WL0 to WL7 are each independently controlled by the row decoder 19.

Each of bit lines BL0 to BLi (where i is an integer equal to or greater than 0) is coupled to a plurality of blocks BLK0 to BLKm, and is coupled to one NAND string NS in each of the string units SU included in each block BLKm. That is, each of the bit lines BL0 to BLi is coupled to the drains of the select transistors ST1 of a plurality of NAND strings NS in the same column among a plurality of NAND strings NS arranged in a matrix in each block BLKm. A source line SL is coupled to the blocks BLK0 to BLKm. That is, the source line SL is coupled to the sources of the select transistors ST2 included in each block BLKm.

In short, each string unit SU includes a plurality of NAND strings NS coupled to different bit lines BL and coupled to the same select gate line SOD. Each block BLKm includes a plurality of string units SU sharing the word lines WL. Furthermore, the memory cell array 16 includes a plurality of blocks BLK0 to BLKm sharing the bit lines BL.

The block BLKm is, for example, a data erase unit. That is, data retained in the memory cell transistors MT included in the block BLKm is erased in a batch. Data may be erased in units of string units SU or in smaller units.

A plurality of memory cell transistors MT sharing a word line WL in one string unit SU will be referred to as a "cell unit CU". A set of 1-bit data items stored in the respective memory cell transistors MT included in the cell unit CU will be referred to as a "page". The storage capacity of the cell unit CU changes in accordance with the number of bits of data stored in each memory cell transistor MT. For example, the cell unit CU stores 1-page data when each memory cell transistor MT stores 1-bit data, stores 2-page data when each memory cell transistor MT stores 2-bit data, and stores 3-page data when each memory cell transistor MT stores 3-bit data.

A write operation and a read operation are performed on the cell unit CU in units of pages. In other words, a read operation and a write operation are collectively performed on a plurality of memory cell transistors MT coupled to one word line WL provided in one string unit SU.

The memory cell array 16 may have other configurations. For example, the memory cell array 16 may have the configuration described in U.S. patent application Ser. No. 12/407,403, entitled "THREE DIMENSIONAL STACKED NONVOLATILE SEMICONDUCTOR MEMORY", filed on Mar. 19, 2009. The memory cell array 16 may also have the configuration described in each of U.S. patent application Ser. No. 12/406,524, entitled "THREE DIMENSIONAL STACKED NONVOLATILE SEMICONDUCTOR MEMORY", filed on Mar. 18, 2009; U.S. patent application Ser. No. 14/679,991, entitled "NON-VOLATILE SEMICONDUCTOR STORAGE DEVICE AND METHOD OF MANUFACTURING THE SAME", filed on Mar. 25, 2010; and U.S. patent application Ser. No. 12/532,030, entitled "SEMICONDUCTOR MEMORY AND METHOD FOR MANUFACTURING SAME", filed on Mar. 23, 2009. The entire contents these patent applications are incorporated herein by reference.

1.1.2 Cross-Sectional Structure of Memory Cell Array

Next, a cross-sectional structure a memory cell transistor in the memory cell array 16 in the embodiment will be described. FIG. 3 is a cross-sectional view of a memory cell transistor in the memory cell array 16. In FIG. 3 and the subsequent drawings, two directions parallel to the surface of the semiconductor substrate 30 and orthogonal to each other are defined as an X direction and a Y direction, and the direction orthogonal to a surface defined by the X and Y directions (X-Y plane) is defined as a Z direction (stacking direction). In FIG. 3, interlayer insulating layers between conductive layers are omitted.

As shown in FIG. 3, the memory cell array 16 includes conductive layers 31 to 34, a memory pillar MP, and a contact plug CP1, which are provided above the semiconductor substrate 30, Specifically, a conductive layer 31 is provided above the semiconductor substrate 30. The conductive layer 31 has a plate-like shape parallel to the X-Y plane, and functions as a source line SL. The principal surface of the semiconductor substrate 30 corresponds to the X-Y Plane. The conductive layer 31 includes, for example, polysilicon doped with impurities, or tungsten (W).

On the conductive layer 31, a plurality of slits SLT extending along the X-Z plane are aligned in the Y direction. A structure (or a layer stack) between adjacent slits SLT on the conductive layer 31 corresponds to, for example, one string unit SU.

A conductive layer 32, a plurality of conductive layers 33, a conductive layer 34, and a conductive layer 35 are provided, in order from the lowermost layer, between adjacent slits SLT on the conductive layer 31. Of the conductive layers, those adjacent to each other in the Z direction are stacked with an interlayer insulating film interposed therebetween. The conductive layers 32 to 34 each have a plate-like shape parallel to the X-Y plane. The conductive layer 32 functions as a select gate line SGS. The conductive layers 33 respectively function as word lines WL0 to WL7 in order from the lowermost layer. The conductive layer 34 functions as a select gate line SGD. The conductive layers 32 to 34 include, for example, tungsten (W) or polysilicon.

A plurality of memory pillars MP are arranged in a staggered manner in the X and Y directions. The memory pillars MP each extend through (or pass through) the layer stack between slits SLT in the Z direction. Each memory pillar MP passes through the conductive layers 34, 33, and 32 from above the conductive layer 34 to reach the upper surface of the conductive layer 31. Each memory pillar MP functions as one NAND string NS.

The memory pillar MP includes, for example, a block insulating layer 40, a charge storage layer 41, a tunnel insulating layer (also referred to as a "tunnel insulating film") 42, and a semiconductor layer 43. Specifically, a block insulating layer 40 is provided on an inner wall of a memory hole for forming a memory pillar. MP. A charge storage layer 41 is provided on an inner wall of the block insulating layer 40. A tunnel insulating layer 42 is provided on an inner wall of the charge storage layer 41. A semiconductor layer 43 is provided inside the tunnel insulating layer 42. The memory pillar MP may have a structure in which a core insulating layer is provided inside the semiconductor layer 43.

In the above-described configuration of the memory pillar MP, an intersection of the memory pillar MP and the conductive layer 32 functions as a select transistor ST2. Intersections of the memory pillar MP and the respective conductive layers 33 function as memory cell transistors MT0 to MT7. An intersection of the memory pillar MP and the conductive layer 34 functions as a select transistor ST1.

The semiconductor layer 43 functions as a channel layer of each of the memory cell transistors MT and the select transistors ST1 and ST2. A current path of a NAND string NS is formed inside the semiconductor layer 43.

The charge storage layer 41 has a function of storing a charge injected from the semiconductor layer 43 in each memory cell transistor MT. The charge storage layer 41 includes, for example, a silicon nitride film.

The tunnel insulating layer 42 functions as a potential barrier when a charge is injected from the Semiconductor layer 43 into they charge storage layer 41, or when a charge stored in the charge storage layer 41 is diffused into the semiconductor layer 43. The tunnel insulating layer 42 includes, for example, a silicon oxide film.

The block insulating layer 40 prevents the charge stored in the charge storage layer 41 from diffusing into the conductive layers 33 (word lines WL). The block insulating layer 40 includes, for example, a silicon oxide layer and a silicon nitride layer.

A conductive layer 35 is provided above the upper surface of the memory pillar MP with an interlayer insulating layer interposed therebetween. The conductive layer 35 has a linear shape extending in the Y direction, and functions as a bit line BL. A plurality of conductive layers 35 are aligned in the X direction; and are each electrically coupled to one corresponding memory pillar MP for each string unit SU. Specifically, in each string unit SU, a contact plug CP1 is provided on the semiconductor layer 43 in each memory pillar MP, and one conductive layer 35 is provided on the contact plug CP1. The conductive layer 35 includes, for example, aluminum (Al) or tungsten (W). The contact plug CP1 includes a conductive layer of, for example, tungsten (W).

The number of word lines WL and the number of select gate lines SGD and SGS may be respectively changed in accordance with the number of memory cell transistors MT and the number of select transistors ST1 and ST2.

1.2 Layout of Semiconductor Memory Device

Next, a layout configuration of the semiconductor memory device 10 according to the embodiment will be described. "Right" and "left" in the following description correspond to those in each drawing. In the drawings to be described below, the directions of the X, Y, and Z-direction arrows will be referred to as "positive directions", and the directions opposite to the directions of the X, Y, and Z-direction arrows will be referred to as "negative directions".

1.2.1 Overall Layout

Figure 4:
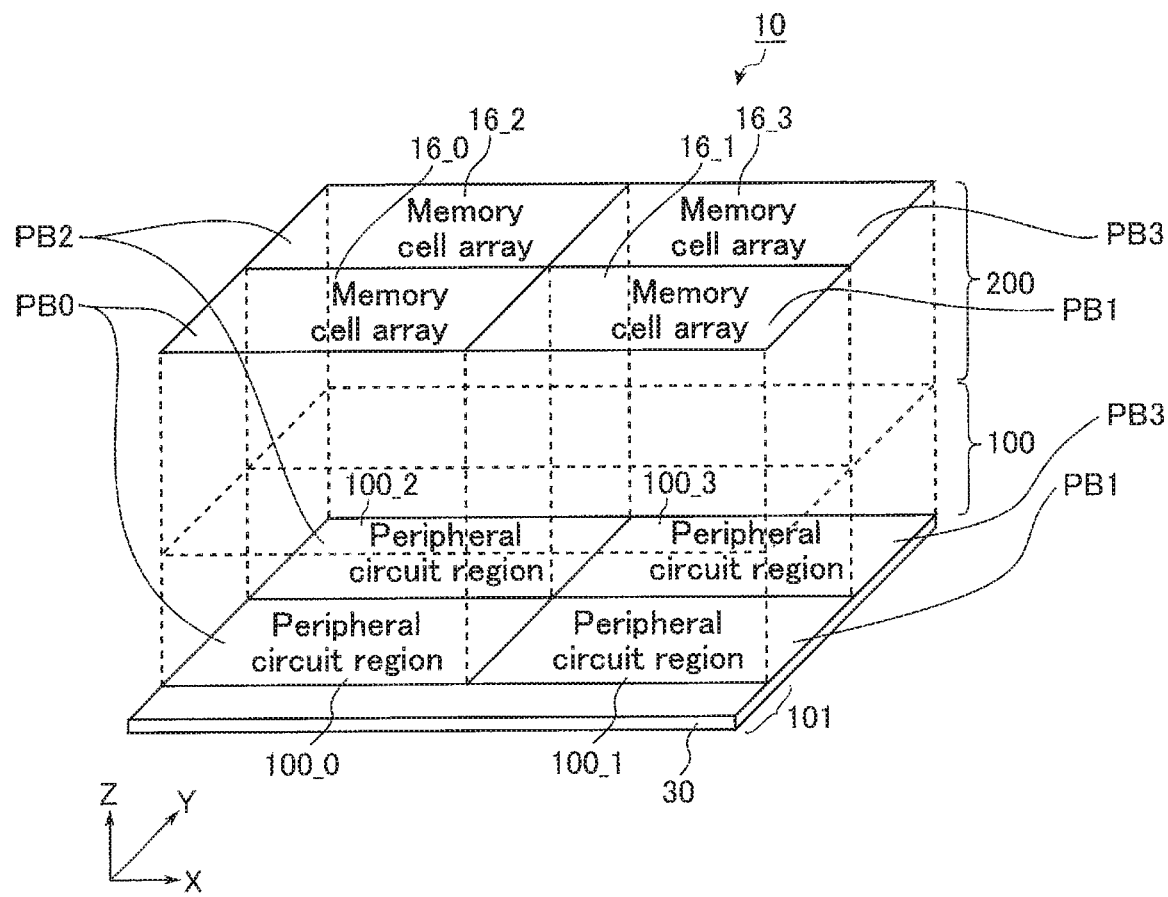
FIG. 4 shows a conceptual perspective view showing a layout of the semiconductor memory device of the embodiment.

An overall layout of the semiconductor memory device 10 of the embodiment will be described below. FIG. 4 is a conceptual perspective view showing an overall layout of the semiconductor memory device 10.

As shown in FIG. 4, the semiconductor memory device 10 includes four planes PB0 to PB3, as described above.

When viewed in the Z direction in FIG. 4 (or viewed from above the memory cell arrays), the plane PB0 is arranged at one negative-X and negative-Y direction end of the semiconductor memory device 10, and the plane PB1 is arranged at one positive-X and negative-Y direction end of the semiconductor memory device 10. Furthermore, the plane PB2 is arranged at one negative-X and positive-Y direction end of the semiconductor memory device 10, and the plane PB3 is arranged at one positive-X and positive-Y direction end of the semiconductor memory device 10. In other words, the plane PB1 is arranged on the positive-X direction side of the plane PB0, and the plane PB2 is arranged on the positive-Y direction side of the plane PB0. Furthermore, the plane. PB3 is arranged on the positive-Y direction side of the plane PB1 and the positive-X direction side of the plane PB2.

A peripheral circuit layer 100 is provided on the semiconductor substrate 30, and a memory cell array layer 200 is provided above the peripheral circuit layer 100. A peripheral circuit region 100_0 is provided in the peripheral circuit layer 100 in the plane PB0. A memory cell array 16_0 is provided in the memory cell array layer 200 in the plane PB0. In the peripheral circuit region 1000, circuits (such as a block decoder, a row control circuit, a column control circuit, and a booster circuit) for controlling the memory cell array 16_0 thereabove are arranged as will be described in detail later.

Similarly, a peripheral circuit region 100_1 is provided in the peripheral circuit layer 100 in the plane PB1. A memory cell array 16_1 is provided in the memory cell array layer 200 in the plane PB1. In the peripheral circuit region 100_1, circuits (such as a block decoder, a row control circuit, a column control circuit, and a booster circuit) for controlling the memory cell array 16_1 thereabove are arranged as will be described in detail later.

A peripheral circuit region. 100_2 is provided in the peripheral circuit layer 100 in the plane PB2. A memory cell array 16_2 is provided in the memory cell array layer 200 in the plane PB2. In the peripheral circuit region 100_2, circuits (such as a block decoder, a row control circuit, a column control circuit, and a booster circuit) for controlling the memory cell array 16_2 thereabove are arranged as will be described in detail later.

A peripheral circuit region 100_3 is provided in the peripheral circuit layer 100 in the plane PB3. A memory cell array 16_3 is provided in the memory cell array layer 200 in the plane PB3. In the peripheral circuit region 100_3, circuits (such as a block decoder, a row control circuit, a column control circuit, and a booster circuit) for controlling the memory cell array 16_3 thereabove are arranged as will be described in detail later.

A peripheral circuit region 101 is provided on the negative-Y direction side of the planes PB0 and PB1. The peripheral circuit region 101 is a region above which (i.e., on a Z-direction side of which) the memory cell array layer 200 is not provided.

1.2.2 Planar Layout of Peripheral Circuit Regions

A planar layout of peripheral circuit regions of the semiconductor memory device 10 according to the embodiment will be described below. FIG. 5 is a diagram showing an outline of the planar layout of the peripheral circuit regions of the semiconductor memory device 10. In FIG. 5, the memory cell array layer 200 provided above (i.e., on a Z-direction side of) the peripheral circuit layer 100 is omitted, and the peripheral circuit layer 100 (or peripheral circuit regions) and the peripheral circuit region 101 are viewed from above (i.e., in the Z direction).

As described above, the semiconductor memory device 10 includes four planes PB0 to PB3. The peripheral circuit region 100_0 is provided in the plane PB0, and the peripheral circuit region 100_1 is provided in the plane PB1 Furthermore, the peripheral circuit region 100_2 is provided in the plane PB2, and the peripheral circuit region 100_3 is provided in the plane PB3. In other words, the peripheral circuit region 100_0 is arranged at one negative-X and negative-Y direction end of the semiconductor memory device 10, the peripheral circuit region 100_1 is arranged on the positive-X direction side of the peripheral circuit region. 100_0, and the peripheral circuit region 100_2 is arranged on positive-Y direction side of the peripheral circuit region 100_0. In addition, the peripheral circuit region 100_3 is arranged on the positive-Y direction side of the peripheral circuit region 100_1 and the positive-X direction side of the peripheral circuit region 100_2.

The peripheral circuit region 101 is arranged on the negative-Y direction side of the peripheral circuit regions 100_0 and 100_1. A peripheral circuit 101, shared by the planes PB0 to PB3 and a pad PD for electrically coupling the semiconductor memory device 10 to an external device are arranged in the peripheral circuit region 101.

As shown in FIG. 5, word line switch circuits WS0a and WS0b are aligned in the X direction at the X-direction center of the peripheral circuit region 100_0 (or plane PB0). The word line switch circuits WS0a and WS0b each extend in the Y direction from a first end of the plane PB0 on the positive-Y direction side (or an end of the plane PB2) to a second end of the plane PB0 on the negative-Y direction side.

On the left side (or negative-X direction side) of the word line switch circuit WS0a of the peripheral circuit region 100_0, a peripheral circuit PE0_1, a sense amplifier SA0_1, and a peripheral circuit PE0_2 are arranged in order from the first end to the second end of the plane PB0. In other words, on the left side of the word line switch circuit WS0a of the plane PB0, a peripheral circuit PE0_1, a sense amplifier SA0_1, and a peripheral circuit PE0_2 are arranged in order in the neggative-Y direction from the plane PB2 side.

On the right side (or positive-X direction side) of the word line switch circuit WS0b of the peripheral circuit region 100_0, a peripheral circuit PE0_3, a sense amplifier SA0_2, and a peripheral circuit PE0_4 are arranged in order from the first end to the second end of the plane PB0. In other words, on the right side of the word line switch circuit WS0b of the plane PB0, a peripheral circuit. PE0_3, a sense amplifier SA02, and a peripheral circuit PE0_4 are arranged in order in the negative-Y direction from the plane PB2 side.

The layout of the circuit blocks in the plane PB1 and the above-described layout of the circuit blocks in the plane PB0 are almost symmetric with respect to the border between the plane PB0 and the plane PB1.

Word line switch circuits WS1b and WS1a are aligned in the X direction at the X-direction center of the peripheral circuit region 100_1 (or plane PB1). The word line switch circuits WS1a and WS1b each extend in the Y direction from a first end of the plane PB1 on the positive-Y direction side (or an end of the plane PB3) to a second end of the plane PB1 on the negative-Y direction side.

On the right side (or positive-X direction side) of the word line switch circuit WS1a of the peripheral circuit region 100_1, a peripheral circuit PE1_1, a sense amplifier SA1_1, and a peripheral circuit. PE1_2 are arranged in order from the first end to the second end of the plane PE31. In other words, on the right side of the word line switch circuit WS1a of the plane PB1, a peripheral circuit PE1_1, a sense amplifier SA1_1, and a peripheral circuit PE1_2 are arranged in order in the negative-Y direction from the plane PB3 side.

On the left side (or negative-X direction side) of the word line switch circuit WS1b of the peripheral circuit region 100_1, a peripheral circuit PE1_3, a sense amplifier SA1_2, and a peripheral circuit PE1_4 are arranged in order from the first end to the second end of the plane PB1. In other words, on the left side of the word line switch circuit WS1b of the plane PB1, a peripheral circuit PE1_3, a sense amplifier SA1_2, and a peripheral circuit PE1_4 are arranged in order in the negative-Y direction from the plane PB3 side.

The layout of the circuit blocks in the plane PB2 and the above-described layout of the circuit blocks in the plane PB0 are almost symmetric with respect to the border between the plane PB0 and the plane PB2.

Word line switch circuits WS2a and WS2b are aligned in the X direction at the X-direction center of the peripheral circuit region 100_2 (or plane PB2). The word line switch circuits WS2a and WS2b each extend in the Y direction from a first end of the plane PB2 on the negative-Y direction side (or an end of the plane PB0) to a second end of the plane PB2 on the positive-Y direction side.

On the left side (or negative-X direction side) of the word line switch circuit. WS2a of the peripheral circuit region 100_2, a peripheral circuit PE2_1, a sense amplifier SA2_1, and a peripheral circuit PE2_2 are arranged in order from the first end to the second end of the plane PB2. In other words, on the left side of the word line switch circuit WS2a of the plane PB2, a peripheral circuit PE2_1, a sense amplifier SA2_1, and peripheral circuit PE2_2 are arranged in order in the positive-Y direction from the plane PB0 side.

On the right side (or positive-X direction side) of the word line switch circuit WS2b of the peripheral circuit region 100_2, a peripheral circuit PE2_3, a sense amplifier SA2_2, and a peripheral circuit PE1_4 are arranged in order from the first end to the second end of the plane PB1. In other words, on the right side of the word line switch circuit WS2b of the plane PB2, peripheral circuit PE2_3, a sense amplifier SA2_2, and a peripheral circuit PE2_4 are arranged in order in the positive-Y direction from the plane PB0 side.

The layout of the circuit blocks in the plane PB3 and the above-described layout of the circuit blocks in the plane PB1 are almost symmetric with respect to the border between the plane PB1 and the plane PB3. The layout of the circuit blocks in the plane PB3 and the above-described layout of the circuit blocks in the plane PB2 are almost symmetric with respect to the border between the plane PB2 and the plane PB3.

Word line switch circuits WS3b and WS3a are aligned in the X direction at the X-direction center of the peripheral circuit region 100_3 (or plane. PB3). The word line switch circuits WS3a and WS3b each extend in the Y direction from a first end of the plane PB3 on the negative-Y direction side (or an end of the plane PB1) to a second end of the plane PB3 on the positive-Y direction side.

On the right side (or positive-X direction side) of the word line switch circuit WS3a of the peripheral circuit region 100_3, a peripheral circuit PE3_1, a sense amplifier SA3_1, and a peripheral circuit PE3_2 are arranged in order from the first end to the second end of the plane PB3. In other words, on the right side of the word line switch circuit WS3*a* of the plane PB3, a peripheral circuit PE3_1, a sense amplifier SA3_1, and a peripheral circuit PE3_2 are arranged in order in the positive-Y direction from the plane PB1 side.

On the left side (or negative-X direction side) of the word line switch circuit WS3*b* of the peripheral circuit region 100_3, a peripheral circuit PE3_3, a sense amplifier SA3_2, and a peripheral circuit PE3_4 are arranged in order from the first end to the second end of the plane PB3. In other words, on the left side of the word line switch circuit WS3*b* of the plane PB3, a peripheral circuit PE3_3, a sense amplifier SA3_2, and a peripheral circuit PE3_4 are arranged in order in the positive-Y direction from the plane PB1 side.

The sense amplifier 21 shown in FIG. 1 includes sense amplifiers SA0_1, SA0_2, SA1_1, SA1_2, SA2_1, SA2_2, SA3_1, and SA3_2. Hereinafter, a "sense amplifier SA" refers to each of the sense amplifiers SA0_1, SA0_2, SA1_1, SA1_2, SA2_1, SA2_2, SA3_1, and SA3_2.

Figure 6:
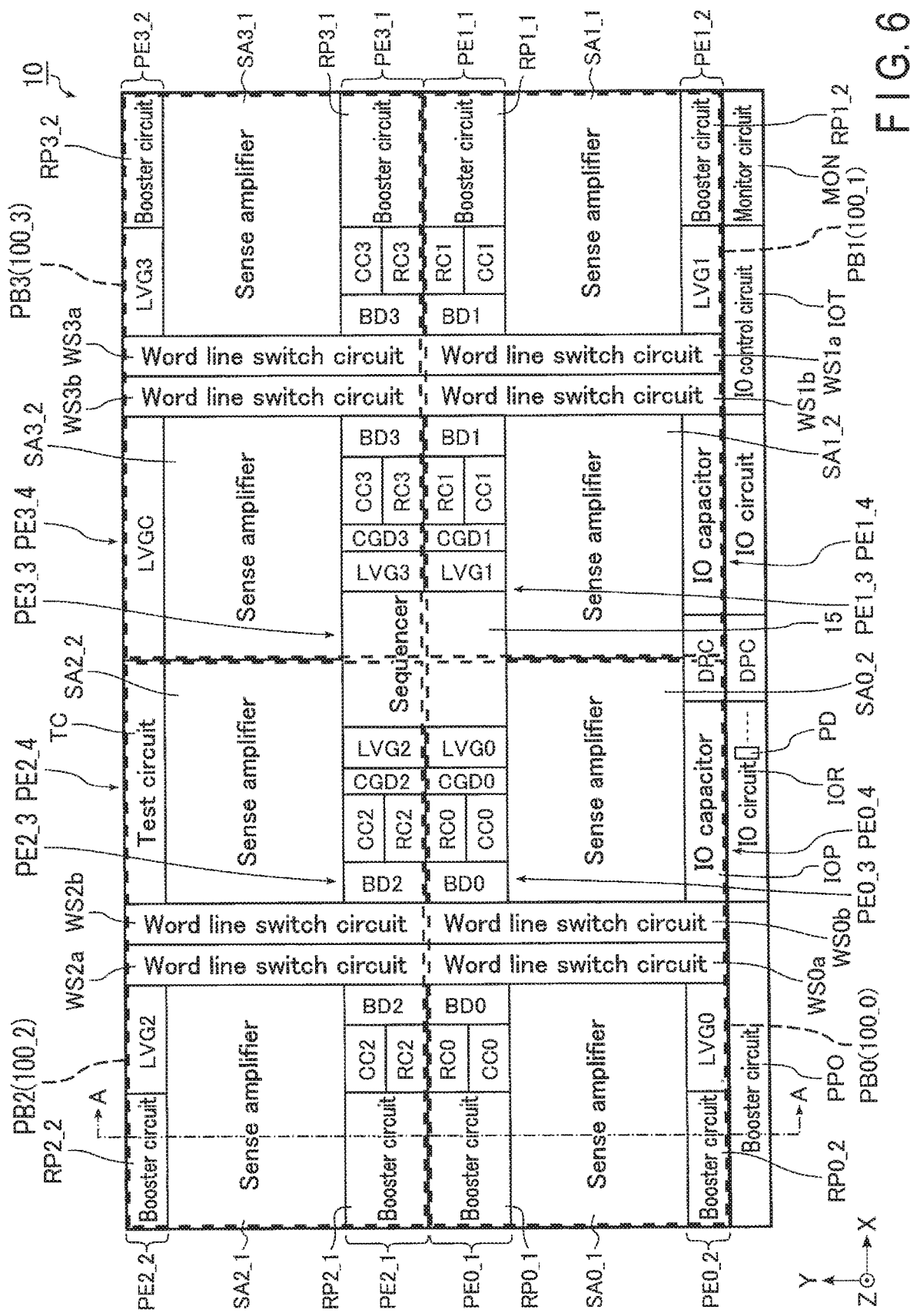
FIG. 6 is a diagram showing details of the planer layout of the peripheral circuit regions in the embodiment.

Next, details of the planar layout of peripheral circuit regions the semiconductor memory device 10 will be described. FIG. 6 is a diagram showing details of the planar layout of peripheral circuit regions of the semiconductor memory device 10. As in FIG. 5, the memory cell array layer 200 provided above the peripheral circuit layer 100 is omitted, and the peripheral circuit layer (or peripheral circuit regions) 100 and the peripheral circuit region 101 are viewed from above (i.e., in the Z direction) in FIG. 6.

Hereinafter, a planar layout of the plane PB0 will be described.

As described above, on the left side (or negative-X direction side) of the word line switch circuit WS0*a* of the plane PB0, the peripheral circuit PE0_1, the sense amplifier SA0_1, and the peripheral circuit PE0_2 are arranged.

The peripheral circuit PE0_1 includes, for example, a block decoder BD0, a row control circuit RC0, a column control circuit CC0, and a booster circuit RP0_1. The block decoder BD0 is arranged on the negative-X direction side of the word line switchcircuit WS0*a*. The row control circuit RC0 and the column control circuit CC0 are arranged on the negative-X direction side of the block decoder BD0. The booster circuit RP01 is arranged on the negative-X direction side of the row control circuit RC0 and the column control circuit CC0.

The sense amplifier SA0_1 includes a sense amplifier unit, a bit line hookup region, and a data latch circuit. The sense amplifier SA0_1 is arranged between the peripheral circuit PE0_1 and the peripheral circuit PE0_2.

The peripheral circuit PE0_2 includes a low-voltage generator LVG0 and a booster circuit RP0_2. The low-voltage generator LVG0 is arranged on the negative-X direction side of the word line switch circuit WS0*a*. The booster circuit RP0_2 is arranged on the negative-X direction side of the low-voltage generator LVG0.

On the right side (or positive-X direction side) of the word line switch circuit WS0*b* of the plane PB0, the peripheral circuit PE0_3, the sense amplifier SA0_2, and the peripheral circuit PE0_4 are arranged.

The peripheral circuit PE0_3 includes, for example, a block decoder BD0, a row control circuit RC0, a column control circuit CC0, a driver CGD0, a low-voltage generator LVG0, and a part of the sequencer 15. The block decoder BD0 is arranged on the positive-X direction side of the word line switch circuit WS0*b*. The row control circuit RC0 and the column control circuit CC0 are arranged on the positive-X direction side of the block decoder BD0. The driver CGD0 is arranged on the positive-X direction side of the row control circuit RC0 and the column control circuit CC0. The low-voltage generator LVG0 is arranged on the positive-X direction side of the driver CGD0. The part of the sequencer 15 is arranged on the positive-X direction side of the low-voltage generator ING0.

The sense amplifier SA0_2 includes a sense amplifier unit, a bit line hookup region, and a data latch circuit. The sense amplifier SA0_2 is arranged between the peripheral circuit PE0_3 and the peripheral circuit PE0_4.

The peripheral circuit PE0_4 includes an IO capacitor IOP and a part of a data path circuit DPC. The IO capacitor IOP is arranged on the positive-X direction side of the word line switch circuit WS0*b*. The data path circuit DPC is arranged on the positive-X direction side of the IO capacitor IOP.

Next, a planar layout of the plane PB will be described.

On the right side (or positive-X direction side) of the word line switch circuit WS1*a* of the plane PB1, the peripheral circuit PE1_1, the sense amplifier SA1_1, and the peripheral circuit PE1_2 are arranged.

The peripheral circuit PE1_1 includes, for example, a block decoder BD1, a row control circuit RC1, a column control circuit CC1, and a booster circuit RP1_1. The block decoder BD1 is arranged on the positive-X direction side of the word line switch circuit WS1*a*. The row control circuit RC1 and the column control circuit CC1 are arranged on the positive-X direction side of block decoder BD1. The booster circuit RP1_1 is arranged on the positive-X direction side of the row control circuit RC1 and the column control circuit CC1.

The sense amplifier SA1_1 includes a sense amplifier unit, a bit line hookup region, and a data latch circuit. The sense amplifier SA1_1 is arranged between the peripheral circuit and the peripheral circuit PE1_2.

The peripheral circuit PE1_2 includes a low-voltage generator LVG1 and a booster circuit RP1_2. The low-voltage generator LVC1 is arranged on the positive-X direction side of the word line switch circuit WS1*a*. The booster circuit RP1_2 is arranged on the positive-X direction side of the low-voltage generator LVG1.

On the left side (or negative-X direction side) of the word line switch circuit WS1*b* of the plane PE1, the peripheral circuit PE1_3, the sense amplifier SA1_2, and the peripheral circuit PE1_4 are arranged.

The peripheral circuit PE1_3 includes, for example, a block decoder BD1, a row control circuit RC1, a column control circuit CC1, a driver CGD1, a low-voltage generator LVG1, and a part of the sequencer 15. The block decoder BD1 is arranged on the negative-X direction side of the word line switch circuit WS1*b*. The row control circuit RC1 and the column control circuit CC1 are arranged on the negative-X direction side of the block decoder BD1. The driver CCD1 is arranged on the negative-X direction side of the row control circuit RC1 and the column control circuit CC1. The low-voltage generator. LVG1 is arranged on the negative-X direction side of the driver CGD1. The part of the sequencer 15 is arranged on the negative-x direction side of the low-voltage generator LVG1.

The sense amplifier SA1_2 includes a sense amplifier unit, a bit line hookup region, and a data latch circuit. The sense amplifier SA1_2 is arranged between the peripheral circuit PE1_3 and the peripheral circuit PE14.

The peripheral circuit PE1_4 includes an ID capacitor IOP and a part of the data path circuit DPC. The IO capacitor TOP is arranged on the negative-X direction side of the word line switch circuit WS1b. The data path circuit DPC is arranged on the negative-X direction side of the IO capacitor IOP.

Next, a planar layout of the plane PB2 will be described.

On the left side (or negative-x direction side) of the word line switch circuit WS2a of the plane PB2, the peripheral circuit. PE2_1, the sense amplifier SA2_1, and the peripheral circuit PE2_2 are arranged.

The peripheral circuit PE2_1 includes, for example, a block decoder BD2, a row control circuit RC2, a column control circuit CC2, and a booster circuit RP2_1. The block decoder BD2 is arranged on the negative-X direction side of the word line switch circuit WS2a. The row control circuit RC2 and the column control circuit CC2 are arranged on the negative-X direction side of the block decoder BD2. The booster circuit RP2_1 is arranged on the negative-X direction side of the row control circuit RC2 and the column control circuit CC2.

The sense amplifier SA2_1 includes a sense amplifier unit, a bit line hookup region, and a data latch circuit. The sense amplifier SA2_1 is arranged between the peripheral circuit PE2_1 and the peripheral circuit PE2_2.

The peripheral circuit PE2_2 includes a low-voltage generator LVG2 and a booster circuit RP2_2. The low-voltage generator LVG2 is arranged on the negative-X direction side of the word line switch circuit WS2a. The booster circuit RP2_2 is arranged on the negative-X direction side of the low-voltage generator LVG2.

On the right side (or positive-X direction side) of the word line switch circuit WS2b of the plane PB2, the peripheral circuit PE2_3, the sense amplifier SA2_2, and the peripheral circuit PE2_4 are arranged.

The peripheral circuit. PE2_3 includes, for example, a block decoder BD2, a row control circuit RC2, a column control circuit CC2, a driver CGD2, a low-voltage generator LVG2, and a part of the sequencer 15. The block decoder BD2 is arranged on the positive-X direction side of the word line switch circuit WS2b. The row control circuit RC2 and the column control circuit CC2 are arranged on the positive-X direction side of the block decoder BD2. The driver CGD2 is arranged on the positive-X direction side of the row control circuit RC2 and the column control circuit CC2. The low-voltage generator LVG2 is arranged on the positive-X direction side of the driver CGD2. The part of the sequencer 15 is arranged on the positive-X direction side of the low-voltage generator LVG2.

The sense amplifier SA2_2 includes a sense amplifier unit, a bit line hookup region, and a data latch circuit. The sense amplifier SA2_2 is arranged between the peripheral circuit PE2_3 and the peripheral circuit PE2_4.

The peripheral circuit PE2_4 includes a test circuit TC. The test circuit TC is arranged on the positive-X direction side of the word line switch circuit WS2b.

Next, a planar layout of the plane PB3 will be described.

On the right side (or positive-X direction side) of the word line switch circuit WS3a of the plane PB3, the peripheral circuit PE3_1, the sense amplifier SA3_1, and the peripheral circuit PE3_2 are arranged.

The peripheral circuit PE3_1 includes, for example, a block decoder BD3, a row control circuit RC3, a column control circuit CC3, and a booster circuit RP3_1. The block decoder BD3 is arranged on the positive-X direction side of the word line switch circuit WS3a. The row control circuit RC3 and the column control circuit CC3 are arranged on the positive-X direction side of the block decoder BD3. The booster circuit RP3_1 is arranged on the positive-X direction side of the row control circuit RC3 and the column control circuit CC3.

The sense amplifier SA3_1 includes a sense amplifier unit, a bit line hookup region, and a data latch circuit. The sense amplifier SA3_1 is arranged between the peripheral circuit PE3_1 and the peripheral circuit PE3_2.

The peripheral circuit PE3_2 includes a low-voltage generator LVG3 and a booster circuit RP3_2. The low-voltage generator LVG3 is arranged on the positive-X direction side of the word line switch circuit WS3a, The booster circuit RP3_2 is arranged on the positive-X direction side of the low-voltage generator LVG3.

On the left side (or negative-n direction side) of the word line switch circuit WS3b of the plane PB3, the peripheral circuit PE3_3, the sense amplifier SA3_2, and the peripheral circuit PE3_4 are arrange.

The peripheral circuit PE3_3 includes, for example, a block decoder BD3, a row control circuit RC3, a column control circuit CC3, a driver CGD3, a low-voltage generator LVG3, and a part of the sequencer 15. The block decoder BD3 is arranged on the negative-X direction side of the word line switch circuit WS3b. The row control circuit RC3 and the column control circuit CC3 are arranged on the negative-X direction side of the block decoder. BD3. The driver CGD3 is arranged on the negative-X direction side of the row control circuit RC3 and the column control circuit CC3. The low-voltage generator LVG3 is arranged on the negative-X direction side of the driver CGD3. The part of the sequencer 15 is arranged on the negative-X direction side of the low-voltage generator LVG3.

The sense amplifier SA3_2 includes a sense amplifier unit, a bit line hookup region, and a data latch circuit. The sense amplifier SA3_2 is arranged between the peripheral circuit PE3_3 and the peripheral circuit PE3_4.

The peripheral circuit PE3_4 includes a low-voltage generator LVGC shared by the planes PB0 to PB3. The low-voltage generator LVGC is arranged on the negative-X direction side of the word line switch circuit, WS3b.

The voltage generator 17 shown in FIG. 1 includes the booster circuits RP0_1, RP0_2, RP2_2, RP3_1, and RP3_2.

Next, a planar layout of the peripheral circuit region 101 will be described.

The peripheral circuit region 101 is provided at an end on the negative-Y direction side of the planes PB0 and PB1 as shown in FIG. 5. The peripheral circuit region 101 includes a booster circuit PPO, an input/output circuit (IO circuit) IOR, a data path circuit DPC, an input/output control circuit (IO control circuit) IOT, and a monitor circuit MON.

The booster circuit PPO is arranged at a first end on the negative-x direction side. The input/output circuit IOR is arranged on the positive-X direction side of the booster circuit PPO. The data path circuit. DPC is arranged on the positive-X direction side of the input/output circuit IOR. Another input/output circuit IOR is arranged on the positive-X direction side of the data path circuit DPC. The input/output control circuit IOT is arranged on the positive-X direction side of the input/output circuit IOR. The monitor circuit MON is arranged on the positive-N direction side of the input/output control circuit IOT. The input/output circuit IOR includes the pad PD shown in FIG. 5.

Hereinafter, the circuit blocks of the planar layout shown in FIG. 6 will be described.

The word line switch circuits WS0a and WS0b are each configured by a transfer transistor which transfers a voltage supplied by a booster circuit to a word line WL in the plane PB0. The block decoder BD0 selects an operation target block in the plane PB0 based on a row address. The row decoder 19 shown in FIG. 1 includes word line switch circuits and block decoders.

The row control circuit RC0 is a circuit for selecting a word line based on a row address in the plane PB0. The column control circuit CC0 is a circuit for selecting a bit line based on a Column address in the plane PB0.

The booster circuit RP0_1, for example, boosts a power supply voltage VEXT, and outputs a voltage used in a read operation in the plane PB0. Like the booster circuit RP0_1, the booster circuit RP0_2 generates a voltage used in a read operation in the plane PB0, but generates a voltage different from the voltage generated by the booster circuit RP0_1. The booster circuit RP0_2 may generate the same voltage as the voltage generated by the booster circuit RP0_1. The booster circuits RP0_1 and RP0_2 each include, for example, a charge pump or a DC-DC converter.

The low-voltage generator LVG0 generates and outputs a low voltage used in the plane PB0. The low voltage generated in the low-voltage generator LVG0 is lower than the power supply voltage VEXT.

The driver CGD0 transfers the voltage output from each booster circuit to a word line in the plane PB0. The IO capacitor is a capacitor coupled between an interconnect that receives a power supply voltage VEXTQ and an interconnect of a voltage VSS, or between an interconnect of an internal power supply voltage VDD and the interconnect of the voltage VSS in the input/output circuit IOR. The power supply voltage VEXTQ is a voltage lower than the power supply voltage VEXT and the internal power supply voltage VDD. The internal power supply voltage VDD is a voltage obtained by lowering the power supply voltage VEXT.

The sense amplifiers SA0_1 and SA0_2 each include a sense amplifier unit, a bit line hookup region, and a data latch circuit. In a read operation in the plane PB0, the sense amplifiers SA0_1 and SA0_2 detect and amplify data stored in the memory cell transistors MT. The bit line hookup region is a region for coupling bit lines BL to the sense amplifiers SA0_1 and SA0_2. The data latch circuit temporarily stores data read by the sense amplifiers SA0_1 and SA0_2.

The word line switch circuits WS1a and WS1b are each configured by a transfer transistor which transfers a voltage supplied by a booster circuit to a word line WL in the plane PB1. The block decoder BD1 selects an operation target block in the plane PB1 based on a row address.

The row control circuit RC1 is a circuit for selecting a word line based on a row address in the plane PB1. The column control circuit CC1 is a circuit for selecting a bit line based on a column address in the plane PB1.

The booster circuit RP1_1, for example, boosts the power supply voltage VEXT, and outputs a voltage used in a read operation in the plane PB1. Like the booster circuit RP1_1, the booster circuit RP1_2 generates a voltage used in a read operation in the plane PB1, which is, however, different from the voltage generated by the booster circuit RP1_1. The booster circuit RP1_2 may generate the same voltage as the voltage generated by the booster circuit RP1_1. The booster circuits RP1_1 and RP1_2 each include, for example, a charge pump or a DC-DC converter.

The low-voltage generator LVG1 generates and outputs a low voltage used in the plane PB1. The low voltage generated in the low-voltage generator LVG1 is lower than the power supply voltage VEXT.

The driver CGD1 transfers the voltage output from each booster circuit to a word line in the plane PB1. The IO capacitor is a capacitor coupled between an interconnect that receives a power supply voltage VEXTQ and an interconnect of a voltage VSS, or between an interconnect of an internal power supply voltage VDD and the interconnect of the voltage VSS in the input/output circuit IOR.

The sense amplifiers SA1_1 and SA1_2 each include a sense amplifier unit, a bit line hookup region, and a data latch circuit. In a read operation in the plane PB1, the sense amplifiers SA1_1 and SA1_2 detect and amplify data stored in the memory cell transistors MT. The bit line hookup region is a region for coupling bit lines BL to the sense amplifiers SA1_1 and SA1_2. The data latch circuit temporarily stores data read by the sense amplifiers SA1_1 and SA1_2.

The word line switch circuits WS2a and WS2b are each configured by a transfer transistor which transfers a voltage supplied by a booster circuit to a word line WL in the plane PB2. The block decoder BD2 selects an operation target block in the plane PB2 based on a row address.

The row control circuit RC2 is a circuit for selecting a word line based on a row address in the plane PB2. The column control circuit CC2 is a circuit for selecting a bit line based on a column address in the plane PB2.

The booster circuit RP2_1, for example, boosts the power supply voltage VEXT, and outputs a voltage used in a read operation in the plane PB2. Like the booster circuit RP2_1, the booster circuit RP2_2 generates a voltage used in a read operation in the plane PB2, which is, however, different from the voltage generated by the booster circuit RP2_1. The booster circuit RP2_2 may generate the same voltage as the voltage generated by the booster circuit RP2_1. The booster circuits RP2_1 and RP2_2 each include, for example, a charge pump or a DC-DC converter.

The low-voltage generator LVG2 generates and outputs a low voltage used in the plane PB2. The low voltage generated in the low-voltage generator LVG2 is lower than the power supply voltage VEXT.

The driver CGD2 transfers the voltage output from each booster circuit to a word line in the plane PB2. In the test circuit TC, circuits used for various tests are arranged.

The sense amplifiers SA2_1 and SA2_2 each include a sense amplifier unit, a bit line hookup region, and a data latch circuit. In a read operation in the plane PB2, the sense amplifiers SA2_1 and SA2_2 detect and amplify data stored in the memory cell transistors MT. The bit line hookup region is a region for coupling bit lines BL to the sense amplifiers SA2_1 and SA2_2. The data latch circuit temporarily stores data read by the sense amplifiers SA2_1 and SA2_2.

The word line switch circuits WS3a and WS3b are each configured by a transfer transistor which transfers a voltage supplied by a booster circuit to a word line WL in the plane PB3. The block decoder BD3 selects an operation target block in the plane PB3 based on a row address.

The row control circuit RC3 is a circuit for selecting a word line based on a row address in the plane PB3. The column control circuit CC3 is a circuit for selecting a bit line based on a column address in the plane PB3.

The booster circuit RP3_1, for example, boosts the power supply voltage VEXT, and outputs a voltage used in a read operation in the plane PB3. Like the booster circuit RP3_1, the booster circuit RP3_2 generates a voltage used in a read operation in the plane PB3, which is, however, different from the voltage generated by the booster circuit RP3_1. The booster circuit RP3_2 may generate the same voltage as the voltage generated by the booster circuit RP3_1. The booster circuits RP3_1 and RP3_2 each include, for example, a charge pump or a DC-DC converter.

The low-voltage generator LVG3 generates and outputs a low voltage used in the plane PB3. The low voltage generated in the low-voltage generator LVG3 is lower than the power supply voltage VEXT.

The driver CGD3 transfers the voltage output from each booster circuit to a word line in the plane PB3. The low-voltage generator LVGC generates and outputs a low voltage shared by the planes PB0 to PB3. The low voltage generated in the low-voltage generator LVGC is lower than the power supply voltage VEXT.

The sense amplifiers SA3_1 and SA3_2 each include a sense amplifier unit, a bit lie hookup region, and a data latch circuit. In a read operation in the plane PB3, the sense amplifiers SA3_1 and SA3_2 detect and amplify data stored in the memory cell transistors MT. The bit line hookup region is a region for coupling bit lines BL to the sense amplifiers SA3_1 and SA3_2. The data latch circuit temporarily stores data read by the sense amplifiers SA3_1 and SA3_2.

The booster circuit PPO of the peripheral circuit region 101, for example, boosts the power supply voltage VEXT, and outputs a voltage used in read operations in the planes PB0 to PB3. The input/output circuit IOR of the peripheral circuit region 101 receives data and a control signal from an external device, and transmits data and a control signal to an external device. The input/output control circuit IOT of the peripheral circuit region 101 controls the input/output circuit IOR. The input/output circuit IOR and the input/output control circuit IOT correspond to the input/output circuit 11 shown in FIG. 1. In the monitor circuit MON of the peripheral circuit region 101, a circuit that monitors characteristics, etc. of a memory cell is arranged.

Figure 7:
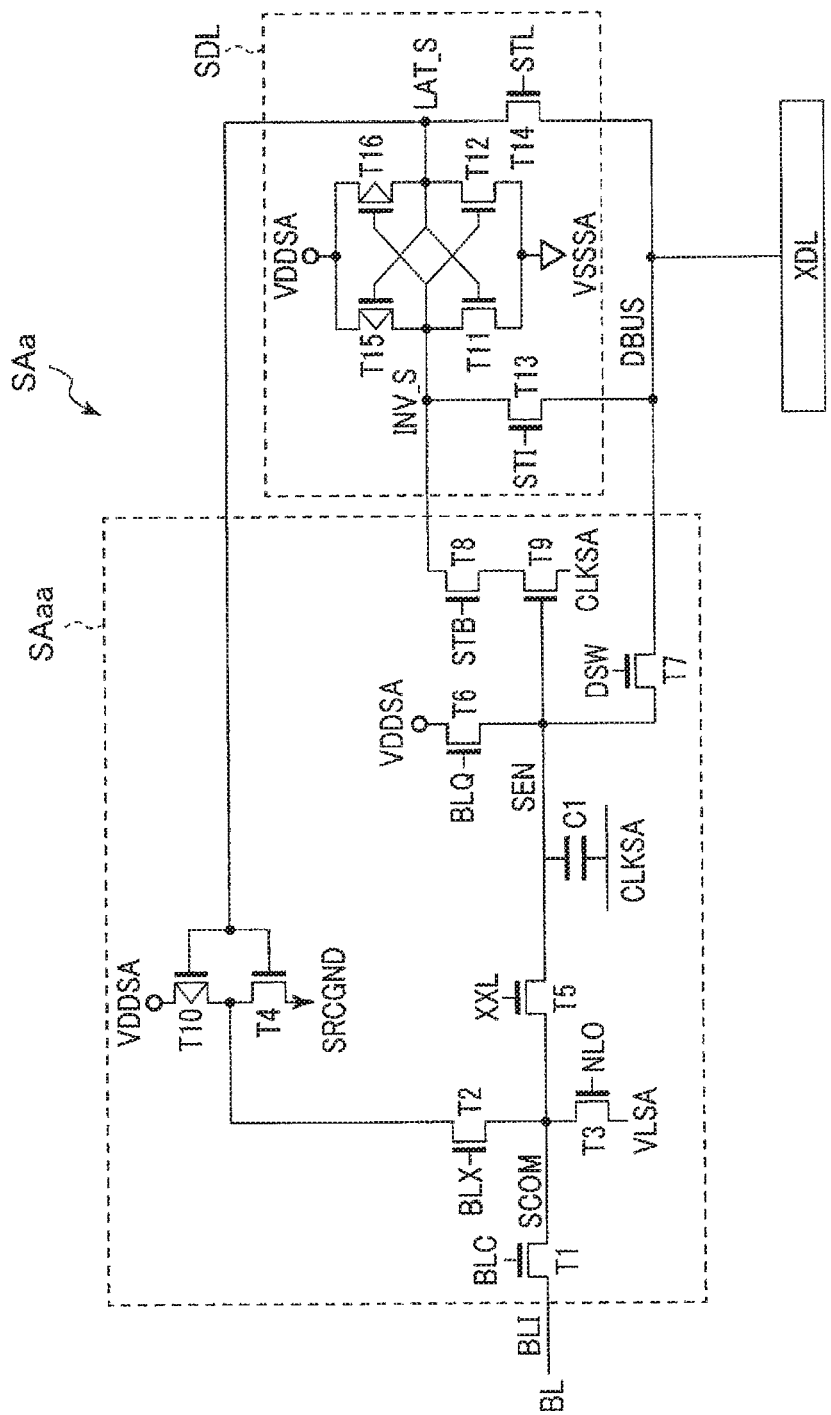
FIG. 7 is a diagram showing an example of the circuit configuration of a sense amplifier in the embodiment.

Next, an example of the circuit configuration of the sense amplifier SA will be described. FIG. 7 is a diagram showing an example of a sense amplifier unit SAa and data latch circuit. XDL of the sense amplifier SA. In the following description, one of the source and drain of a transistor will be referred to as a "first end of a current path", and the other one of the source and drain will be referred to as a "second end of a current path".

The sense amplifier unit SAa includes, for example, a sense unit SAaa and a latch circuit SDL. The sense unit SAaa includes n-channel MOS field effect transistors (hereinafter referred to as "nMOS transistors") T1 to T9, a p-channel MOS field effect transistor (hereinafter referred to as a "pMOS transistor") T10, and a capacitor C1. The latch circuit SDL includes nMOS transistors T11 to T14 and pMOS transistors T15 and T16.

The first end of the current path of the nMOS transistor T1 is coupled to a bit line BL via a node BLT, The second end of the current path of the nMOS transistor T1 is coupled to the first end of the current path of the nMOS transistor T5 via a node SCOM. The gate of the nMOS transistor T1 is supplied with a signal BLC. The gate of the nMOS transistor T5 is supplied with a signal XXL.

The first end of the current path of the nMOS transistor T2 is coupled to the node SCOM. The second end of the current path of the nMOS transistor T2 is coupled to the first end of the current path of the nMOS transistor T4 and the first end of the current path of the pMOS transistor T10. The second end of the current path of the nMOS transistor T4 is supplied with a voltage SRCGND (for example, 0 V). The second end of the current path of the pMOS transistor T10 is supplied with a voltage VDDSA. The gate of the nMOS transistor T2 is supplied with a signal BLX.

The gate of the nMOS transistor T4 and the gate of the pMOS transistor T10 are coupled to a node LAT_S. The nMOS transistor T4 and the pMOS transistor T10 configure an inverter. The inverter functions as a driver for charging a bit line BL, or charging or discharging the voltage of a data bus DBUS and the data latch circuit XDL. Described here is the case where the gates of the nMOS transistor T4 and pMOS transistor T10 are coupled to the node LAT_S; however, if the gates of nMOS transistor T4 and pMOS transistor T10 are coupled to a node INV_S, data retained in the node LAT_S can be transferred.

The first end of the current path of the nMOS transistor T3 is coupled to the node SCOM. The second end of the current path of the nMOS transistor T3 is supplied with a voltage VLSA. The gate of the nMOS transistor T3 is supplied with a signal NLO.

The second end of the current path of the nMOS transistor T5 is coupled to the gate of the nMOS transistor T9 via a node SEN. A first electrode of the capacitor C1 is coupled to the node SEN, and a second electrode of the capacitor C1 is supplied with a signal CLKSA.

The first end of the current path of the nMOS transistor T7 is coupled to the node SEN. The second end of the current path of the nMOS transistor T7 is coupled to the data bus DBUS. The gate of the nMOS transistor T7 is supplied with a signal DEW.

The first end of the current path of the nMOS transistor T6 is coupled to the node SEN. The second end of the current path of the nMOS transistor T6 is supplied with the voltage VDDSA. The gate of the nMOS transistor T6 is supplied with a signal BLQ.

The first end of the current path of the nMOS transistor T9 is coupled to the first end of the current path of the nMOS transistor T8, and the second end of the current path of the nMOS transistor T8 is coupled to the node INV_S. The second end of the current path of the nMOS transistor T9 is supplied with a voltage CLKSA. The gate of the nMOS transistor T8 is supplied with a strobe signal STB.

The node INV_S is coupled to the first end of the current path of the nMOS transistor T11, the first end of the current path of the pMOS transistor T15, the gate of the nMOS transistor T12, and the gate of the pMOS transistor T16. The first end of the current path of the nMOS transistor T12 and the first end of the current path of the pMOS transistor T16 are coupled to the node LAT_S. The node LAT_S is coupled to the gate of the nMOS transistor T11 and the gate of the pMOS transistor T15.

The second ends of the current paths of the pMOS transistors T15 and T16 are supplied with a voltage VDDSA. The second ends of the current paths of the nMOS transistors T11 and T12 are supplied with a voltage VSSSA (for example, 0 V). Each of the set of the nMOS transistor T11 and the pMOS transistor T15, and the set of the nMOS transistor T12 and the pMOS transistor T16 configures an inverter.

The first end of the current path of the nMOS transistor T13 is coupled to the node INV_S, and the second end of the current path of the nMOS transistor T13 is coupled to the data bus DBUS. The gate of the nMOS transistor T13 is supplied with a signal STI.

The first end of the current path of the nMOS transistor T14 is coupled to the node LAT_S, and the second end of the current path of the nMOS transistor T14 is coupled to the data bus DBUS. The gate of the nMOS transistor T14 is supplied with a signal STL. The data latch circuit XDL is coupled to the data bus DBUS. Described above is an example of the circuit configuration of the sense amplifier SA.

The above-described planar layout of the semiconductor memory device 10 shown in FIGS. 5 and 6 can also be described as follows.

The semiconductor memory device 10 includes a memory cell array 16_0 (FIG. 4), a first peripheral circuit PE0_1, a second peripheral circuit PE0_2, and a sense amplifier SA0_1. The memory cell array 16_0 is provided on a Z-direction side of the semiconductor substrate 30, the Z direction intersecting the semiconductor substrate 30, and includes a plurality of memory cells. The first peripheral circuit PE0_1 is provided between the semiconductor substrate 30 and the memory cell array 16_0. The second peripheral circuit PE0_2 is provided between the semiconductor substrate 30 and the memory cell array 16_0 and provided apart from the first peripheral circuit PE0_1 on a Y-direction side of the first peripheral circuit PE0_1, the Y direction intersecting the Z direction. The sense amplifier SA0_1 is provided between the semiconductor substrate 30 and the memory cell array 16_0 and between the first peripheral circuit PE0_1 and the second peripheral circuit. PE0_2, and has a finer design rule than the first peripheral circuit PE0_1 and the second peripheral circuit PE0_2. The Y-direction length of the second peripheral circuit PE0_2 is smaller than half the Y-direction length of the sense amplifier SA0_1.

The sense amplifier SA0_1 includes a circuit for detecting data stored in a memory cell.

The first peripheral circuit PE0_1 and the second peripheral circuit PE0_2 each include a power supply circuit.

The first peripheral circuit PE0_1 includes a first booster circuit RP0_1 which outputs a first voltage, and the second peripheral circuit PE0_2 includes a second booster circuit RP0_2 which outputs a second voltage which differs from the first voltage.

The semiconductor memory device 10 further includes a first conductive layer 31 (source line SL). The first conductive layer 31 has a plate-like shape along the surface of the semiconductor substrate 30, is provided between the memory cell array 16_0 and the first peripheral circuit PE0_1 and second peripheral circuit. PE0_2, and is electrically coupled to memory cells. The second peripheral circuit PE0_2 is provided on a Z-direction side of the vicinity of an end of the first conductive layer 31.

The semiconductor memory device 10 further includes a first conductive layer 35 (bit line BL). The first conductive layer 35 is provided on a Z-direction side of the memory cell array 16_0 opposite to the semiconductor substrate 30, extends in the Y direction, and is electrically coupled to memory cells. The second peripheral circuit PE0_2 is provided on a Z-direction side of the vicinity of an end of the first conductive layer 35.

When viewed in the Z direction, the semiconductor memory device 10 further includes an input/output circuit IOR provided on one Y-direction end of the semiconductor substrate 30 so as not to overlap the memory cell array 16_0 and configured to input and output data to and from a memory cell, and a sequencer 15 provided between the semiconductor substrate 30 and the memory cell array 16_0 and configured to control the sense amplifier SA0_1, the first peripheral circuit PE0_1, and the second peripheral circuit PE0_2. When viewed in the Z direction, the sequencer 15 is separated from the input/output circuit. IOR, and overlaps the memory cell array 16_0.

The semiconductor memory device 10 further includes an IO capacitor IOP provided between the semiconductor substrate 30 and the memory cell array 16_0 and electrically coupled to the input/output circuit IOR. When viewed in the Z direction, the IO capacitor IOP overlaps the memory cell array 16_0.

When viewed in the Z direction, the semiconductor memory device 10 further includes a third peripheral circuit region 101 provided on a Y-direction end of the semiconductor substrate 30 so as not to overlap the memory cell array 16_0 and extending in the X direction, which intersects the Z direction and the Y direction. The third peripheral circuit region 101 includes an input/output circuit IOR which inputs and outputs data to and from a memory cell at its X-direction center, and a power supply circuit (such as a booster circuit PPO) outside the X-direction center.

The semiconductor memory device 10 further includes a plurality of conductive layers 33 stacked on a Z-direction side of the semiconductor substrate 30, and a memory pillar MP passing through the conductive layers 33 in the Z direction and including a semiconductor layer 43. Intersections of the memory pillar NP and the conductive layers 33 function as memory cells.

The semiconductor memory device 10 further includes a plurality of first conductive layers (word lines WL) stacked on a Z-direction side of the semiconductor substrate 30, a plurality of second conductive layers (word lines WL) stacked on a Z-direction side of the semiconductor substrate 30 and provided apart from the first conductive layers in the X direction, which intersects the Z direction and the Y direction, a first memory pillar MP passing through the first conductive layers in the Z direction and including a semiconductor layer 43, a second memory pillar MP passing through the second conductive layers in the Z direction and including a semiconductor layer 43, and a word line switch circuit WS1a provided between the first conductive layers and the second conductive layers and electrically coupling the first conductive layers and the second conductive layers to the first peripheral circuit PE0_1, Intersections of the first memory pillar MP and the first conductive layers and intersections of the second memory pillar MP and the second conductive layers each function as a memory cell.

The semiconductor memory device 10 also includes a first plane PB0 and a second plane, PB1. The first plane PB0 includes a first memory cell array 16_0 provided on a Z-direction side of the semiconductor substrate 30 and including a plurality of first memory cells, a first power supply circuit (for example, the booster circuit RP0_2) provided between the semiconductor substrate 30 and the first memory cell array 16_0 and configured to output a first voltage to be applied to the first memory cells, and a first sense amplifier SA0_1 provided between the semi conductor substrate 30 and the first memory cell array 16_0 and having a finer design rule than the first power supply circuit. The second plane PB1 includes a second memory cell array 16_1 provided on a Z-direction side of the semiconductor substrate 30 and including a plurality of second memory cells, a second power supply circuit (for example, the booster circuit RP1_2) provided between the semiconductor substrate 30 and the second memory cell array 16_1 and configured to output a second voltage to be applied to the second memory cells, and a second sense amplifier SA1_1 provided between the semiconductor substrate 30 and the second memory cell array 16_1 and having a finer design rule than the second power supply circuit. When viewed in the Z direction, the first power supply circuit and the first sense amplifier SA0_1 overlap the first memory cell array 16_0, and the second power supply circuit and the second sense amplifier SA1_1 overlap the second memory cell array 16_1.

The first sense amplifier SA0_1 and the second sense amplifier SA1_1 detect data stored in the first memory cells and the second memory cells, respectively.

The first power supply circuit and the first sense amplifier SA0_1 are aligned in the Y direction, which intersects the Z direction, the second power supply circuit and the second sense amplifier SA1_1 are aligned in the Y direction, the Y-direction length of the first power supply circuit (for example, the booster circuit RP0_2) is smaller than half the Y-direction length of the first sense amplifier SA0_1, and the Y-direction length of the second power supply circuit (for example, the booster circuit RP1_2) is smaller than half the Y-direction length of the second sense amplifier SA1_1.

The semiconductor memory device 10 further includes a third power supply circuit (for example, the booster circuit RP0_1) provided between the semiconductor substrate 30 and the first Memory cell array 16_0 and configured to output a third voltage which differs from the first voltage, and a fourth power supply circuit (for example, the booster circuit RP1_1) provided between the semiconductor substrate 30 and the second memory cell array 16_1 and configured to output a fourth voltage which differs from the second voltage. When viewed in the Z direction, the third power supply circuit overlaps the first memory cell array 16_0, and the fourth power supply circuit overlaps the second memory cell array 16_1.

The semiconductor memory device 10 further includes a first conductive layer 31 (source line SL) and a second conductive layer 31 (source line SL). The first conductive layer 31 has a plate-like shape expanding along the surface of the semiconductor substrate, is provided between the first memory cell array 16_0 and the first power supply circuit and first sense amplifier SA01, and is electrically coupled to the first memory cells. The second conductive layer 31 has a plate-like shape expanding along the surface of the semiconductor substrate, is provided between the second memory cell array 16_1 and the second power supply circuit and second sense amplifier SA11, and is electrically coupled to the second memory cells. The first conductive layer 31 is separated from the second conductive layer 31, the first power supply circuit is arranged on a Z-direction side of the vicinity of an end of the first conductive layer 31, and the second power supply circuit is arranged on a Z-direction side of the vicinity of an end of the second conductive layer 31.

The semiconductor memory device 10 further includes a first conductive layer 35 (bit line BL) and a second conductive layer 35 (bit line BL). The first conductive layer 35 is provided on the Z-direction side of the first memory cell array 16_0 opposite to the semiconductor substrate 30, extends in the Y direction, which intersects the Z direction, and is electrically coupled to the first memory cells. The second conductive layer 35 is provided on the Z-direction side of the second memory cell array 16_1 opposite to the semiconductor substrate 30, extends in the Y direction, and is electrically coupled to the second memory cells. The first conductive layer 35 is separated from the second conductive layer 35, the first power supply circuit is arranged on a Z-direction side of the vicinity of a Y-direction end of the first conductive layer 35, and the second power supply circuit is arranged on a Z-direction side of the vicinity of a Y-direction end of the second conductive layer 35.

The semiconductor memory device 10 further includes a sequencer 15. The sequencer 15 is provided between the semiconductor substrate 30 and the first memory cell array 16_0 and second memory cell array 16_1, and controls the first sense amplifier SA0_1, the second sense amplifier SA1_1, the first power supply circuit, and the second power supply circuit. When viewed in the Z direction, the sequencer 15 straddles the first memory cell array 16_0 and the second memory cell array 16_1.

The semiconductor memory device 10 further includes an input/output circuit IOR configured to input and output data to and from the first memory cells and the second memory cells, and a common circuit (such as the low-voltage generator LVGC or the test circuit TC) used in operations on the first plane PB0 and the second plane PB2. The first plane PB0 and the second plane PB2 are aligned in the Y direction, which intersects the direction, and the input/output circuit IOR is arranged on one end of the first plane PB0 and second plane PB2 aligned in the Y direction, and a common circuit is arranged on the other end of the first plane PB0 and second plane PB2 aligned in the Y direction.

A first read operation on the first memory cells in the first plane is executed asynchronously with a second read operation on the second memory cells in the second plane.

1.2.3 Cross-Sectional Structure of Semiconductor Memory Device

Figure 8:
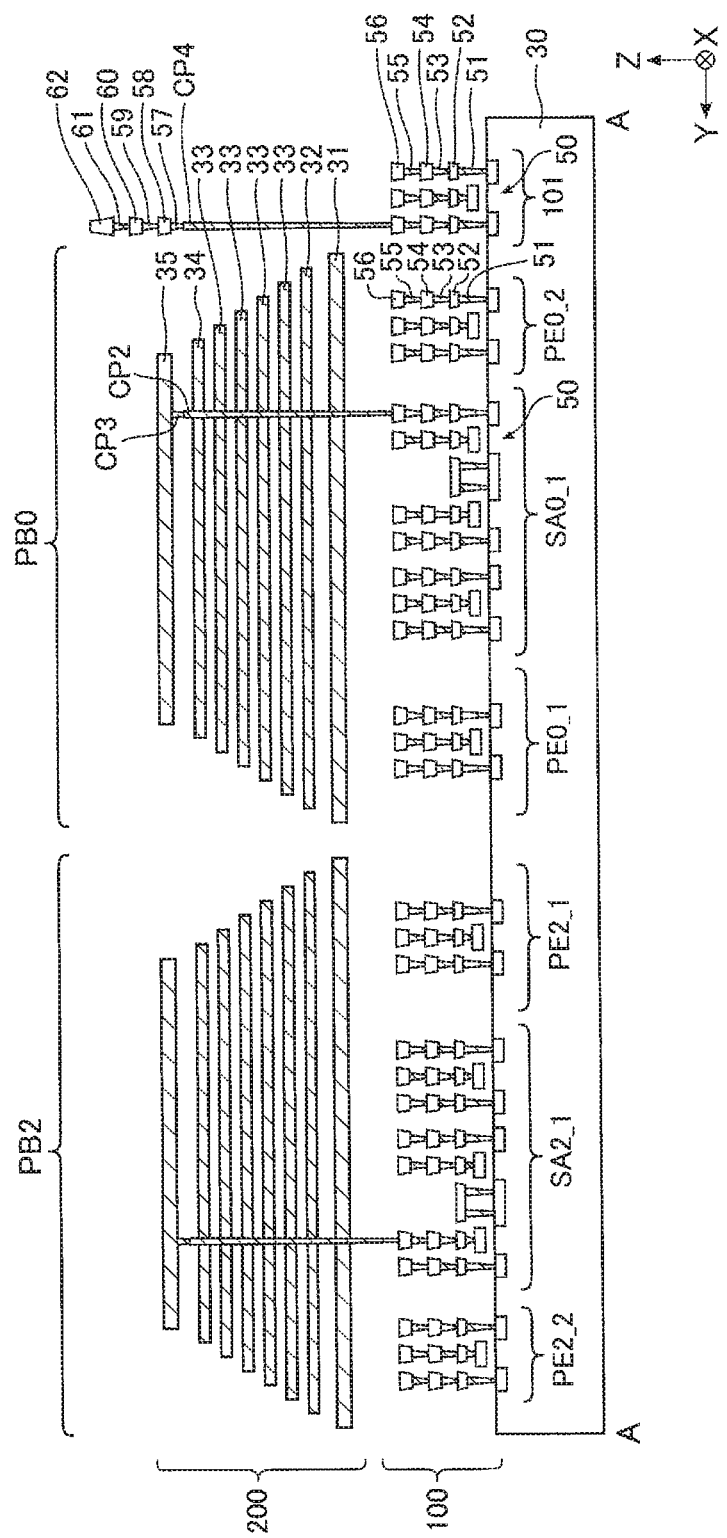
FIG. 8 is a cross-sectional view of the semiconductor memory device of the embodiment.

Hereinafter, a cross-sectional structure of the semiconductor memory device 10 of the embodiment will be described. FIG. 8 shows a cross-sectional view of the semiconductor memory device 10 of the embodiment, taken along line A-A in FIG. 6. In FIG. 8, only four conductive layers serving as word lines are shown, and interlayer insulating layers between conductive layers are omitted.

On the semiconductor substrate 30, the peripheral circuit region 101, the plane PB0, and the plane PB2 are provided in order in the positive-Y direction (or from one end to the other end). The plane PB0 includes the peripheral circuit PE0_2, the sense amplifier SA0_1, and the peripheral circuit PE0_1, which are aligned in the positive-Y direction. The plane PB2 includes the peripheral circuit PE2_1, the sense amplifier SA2_1, and the peripheral circuit PE2_2, which are aligned in the positive-Y direction.

The peripheral circuit layer 100 is provided above (i.e., on a Z-direction side of) the semiconductor substrate 30, and the memory cell array layer 200 is provided above the peripheral circuit layer 100.

A cross-sectional structure of the planes PB0 and PB2 will be described below.

On the semiconductor substrate 30 in the planes PB0 and PB2, a nMOS circuit 50 including a pMOS transistor and an nMOS transistor is arranged.

Above the pMOS transistor and nMOS transistor of the cMOS circuit 50, a via and an interconnect layer coupled to the pMOS transistor and nMOS transistor are repeatedly arranged. Namely, on each of the source regions, drain regions, and gate ectrodes of the pMOS transistor and nMOS transistor, a via 51, an interconnect layer 52, via 53, an interconnect layer 54, a via 55, and an interconnect layer 56 are provided in order. An insulating layer (not shown) is embedded between sets the vias 51, 53, and 55 and the interconnect layers 52, 54, and 56 on the semiconductor substrate 30.

The memory cell array 16_0 is provided above the peripheral circuit layer 100 in the plane PB0. The memory cell array 16_0 includes a conductive layer 31, a conductive layer 32, a plurality of conductive layers 33, a conductive layer 34, a conductive layer 35, and contact plugs CP2 and CP3.

Specifically, a conductive layer 31 is provided above the peripheral circuit layer 100. The conductive layer 31 has a plate-like shape parallel to the X-Y plane, and functions as a source line SL. The conductive layer 31 includes, for example, polysilicon doped with impurities, or tungsten (W).

Above the conductive layer 31, a conductive layer 32, a plurality of conductive layers 33, a conductive layer 34, and a conductive layer 35 are provided, in order from the lowermost layer (i.e., in the positive-Z direction). Of the conductive layers, those adjacent to each other in the Z direction are stacked with an interlayer insulating layer (not shown) interposed therebetween. The conductive layers 32 to 34 each have a plate-like shape parallel to the X-Y plane. The conductive layer 32 functions as a select gate line SGS. The conductive layers 33 respectively function as word lines WL0 to WL3 in order from the lowermost layer. The conductive layer 34 functions as a select gate line SGD. The conductive layers 32 to 34 include, for example, tungsten (W) or polysilicon.

A contact plug CP2 is provided in the sense amplifier SA0_1. The contact plug CP2 extends through (or passes through) the conductive layers 34, 33, 32, and 31 in the Z direction from above the conductive layer 34 to reach the upper surface of the interconnect layer 56 contact plug CP3 is provided on the contact plug CP2. A conductive layer 35 is provided on the contact plug CP3. The conductive layer 35 functions as a bit line BL. The conductive layer 35 is thereby electrically coupled to the sense amplifier SA0_1, which includes the interconnect layer 56, via the contact plugs CP3 and CP2.

The memory cell array 16_2 is provided above the peripheral circuit layer 100 in the plane PB2. The memory cell array 16_2 includes a conductive layer 31, a conductive layer 32, a plurality of conductive layers 33, a conductive layer 34, a conductive layer 35, and contact plugs CP2 and CP3. The specific configuration is the same as the above-described configuration of the memory cell array 16_0.

Hereinafter, a cross-sectional structure of the peripheral circuit region 101 will be described.

On the semiconductor substrate 30 in the peripheral circuit region 101, the cMOS circuit 50, which includes a pMOS transistor and an nMOS transistor, is arranged. On each of the source regions, drain regions, and gate electrodes of the pMOS transistor and nMOS transistor, via 51, an interconnect layer 52, a via 53, an interconnect layer 54, a via 55, and an interconnect layer 56 are provided in order. An insulating layer (not shown) is embedded between sets of the vias 51, 53, and 55 and the interconnect layers 52, 54, and 56 on the semiconductor substrate 30.

No memory cell array is provided above the peripheral circuit layer 100 in the peripheral circuit region 101. A contact plug CP4 is provided on the interconnect layer 56. On the contact plug CP4, a via 57, an interconnect layer 58, a via 59, an interconnect layer 60, a via 61, and an interconnect layer 62 are provided in order. The conductive layer 62 is thereby electrically coupled to the peripheral circuits in the peripheral circuit region 101, which includes the interconnect layer 56, via the via 61, the interconnect layer 60, the via 59, the interconnect layer 58, the via 57, and the contact plug CP4.

The conductive layer 31 (source line SL) of the plane PB0 is separated from, and thus electrically insulated from, the conductive layer 31 (source line SL) of the plane PB2. The border between the conductive layer 31 of the plane PB0 and the conductive layer 31 of the plane PB2 corresponds to the border between the plane PB0 and the plane PB2. An end of the conductive layer 31 of the plane PB0 corresponds to an end of the plane PB0, or an end of the memory cell array 16_0. An end of the conductive layer 31 of the plane PB2 corresponds to an end of the plane PB2, or an end of the memory cell array 16_2. Also in the other planes, an end of the conductive layer 31 corresponds to an end of the plane, or an end of the memory cell array.

The conductive layer 35 (bit line BL) of the plane PB0 is separated from, and thus electrically insulated from, the conductive layer 35 (bit line BL) of the plane PB2. The border between the conductive layer 35 of the plane PB0 and the conductive layer 35 of the plane PB2 corresponds to the border between the plane PB0 and the plane PB2. An end of the conductive layer 35 of the plane PB0 corresponds to an end of the plane PB0, or an end of the memory cell array 16_0. An end of the conductive layer 35 of the plane PB2 corresponds to an end of the plane PB2, or an end of the memory cell array 16_2. Also in the other planes, an end of the conductive layer 35 corresponds to an end of the plane, or an end of the memory cell array.

1.3 Advantageous Effects of Embodiment According to the present embodiment, it is possible to provide a semiconductor memory device with a reduced chip size.

Advantageous effects of the present embodiment will be described in detail below.

The semiconductor memory device 10 includes a plurality of planes PB0 to PB3 provided on the semiconductor substrate 30, and each plane has the following configuration: A memory cell array 16_0 (or 16_1, 16_2, or 16_3) is provided above the semiconductor substrate 30, a first peripheral circuit PE0_1 (or PE1_1, PE2_1, or PE3_1) is provided between the semiconductor substrate 30 and the memory cell array at one Y-direction end of the plane, and a second peripheral circuit PE0_2 (or PE1_2, PE2_2, or PE3_2) is provided at the other Y-direction end of the plane. A sense amplifier SA0_1 (or SA1_1, SA2_1, or SA3_1) is provided between the semiconductor substrate 30 and the memory cell array and between the first peripheral circuit and the second peripheral circuit. The Y-direction length of the second peripheral circuit is smaller than half the Y-direction length of the sense amplifier. This configuration makes it possible to secure a region to arrange an inter-plane common circuit between adjacent planes, and provide a second peripheral circuit in contact with the peripheral circuit region 101, above which no memory cell array is provided on the semiconductor substrate 30. Accordingly, the region of the semiconductor substrate 30 on which a plurality of planes are provided can be reduced. Namely, the chip size of the semiconductor memory device 10 can be reduced.

Moreover, in each plane, word lines WL are separated into those on the left side (or one end side) of the X-direction center and those on the right side (or the other end side) thereof, and the word line switch circuits WS0a and WS0b are arranged between the separated word lines. The word line switch circuit WS0a is coupled to the word lines on the left side, and the word line switch circuit WS0b is coupled to the word lines on the right side. In other words, the word lines on the left side and the word lines on the right side are separately drawn out and coupled to the respective word line switch circuits WS0a and WS0b. By drawing out the word lines on the left side and the word lines on the right side to the respective word line switch circuits WS0a and WS0b, the distance between a word line switch circuit and a word line end in the plane can be reduced to half.

Accordingly, the resistance and parasitic capacitance of the word line can be reduced, and the write operation, read operation, and erase operation can be performed at a higher speed.

In addition, by arranging, for example, the sense amplifier SA0_1 apart from an end of the plane PB0, i.e., by arranging the sense amplifier SA0_1 between the first peripheral circuit PE0_1 and the second peripheral circuit PE0_2, the distance between the bit line hookup region coupling the sense amplifier SA0_1 to bit lines BL and the memory pillar MP including memory cell transistors MT can be reduced; therefore, the write operation and read operation can be performed at a higher speed. Furthermore, the semiconductor memory device 10 includes four planes, which operate independently of one another. For example, the planes can perform read operations asynchronously. Therefore, in each plane, the power supply circuit used for a read operation in the plane is arranged in the plane. Namely, the power supply circuit used in the plane is not arranged in another plane, but arranged between the semiconductor substrate 30 and the memory cell array 16 in the plane. Consequently, noise made by the power supply circuit in the read operation provides less influence on a read operation in another plane.

Moreover, although a NAND flash memory is described as an example of the semiconductor memory device in the above-described embodiment, the semiconductor memory device is not limited to the NAND flash memory, and the embodiment can be applied to other semiconductor memories in general, and to various storage devices other than the semiconductor memories. Furthermore, the order of the steps in the above-described flowchart may be altered as much as possible.

While some embodiments have been described, those embodiments have been presented as examples, and are not intended to limit the scope of the invention. These embodiments can be implemented in various other forms, and various omissions, replacements, and changes can be made without departing from the spirit of the invention. The embodiments and their modifications are included in the scope and spirit of the invention and are included in the scope of the claimed inventions and their equivalents.

What is claimed is:

1. A semiconductor memory device comprising:
a memory cell array provided above a substrate in a first direction and including a plurality of memory cells, the first direction intersecting a surface of the substrate;
a first peripheral circuit provided between the substrate and the memory cell array;
a second peripheral circuit provided between the substrate and the memory cell array and apart from the first peripheral circuit in a second direction, the second direction being parallel to the surface of the substrate; and
a sense amplifier provided between the substrate and the memory cell array and between the first peripheral circuit and the second peripheral circuit,
wherein a length of the second peripheral circuit in the second direction is smaller than half of a length of the sense amplifier in the second direction.

2. The semiconductor memory device according to claim 1, wherein the sense amplifier includes a circuit configured to detect data stored in the memory cells.

3. The semiconductor memory device according to claim 1, wherein the first peripheral circuit and the second peripheral circuit each include a power supply circuit.

4. The semiconductor memory device according to claim 1, wherein the first peripheral circuit includes a first booster circuit configured to output a first voltage, and the second peripheral circuit includes a second booster circuit configured to output a second voltage which differs from the first voltage.

5. The semiconductor memory device according to claim 1, further comprising:
a first conductive layer having a plate-like shape expanding along the surface of the substrate, the first conductive layer being provided between the memory cell array and the first peripheral circuit and second peripheral circuit, and the first conductive layer being electrically coupled to the memory cells,
wherein the second peripheral circuit is provided below the first conductive layer in the first direction in a vicinity of an end of the first conductive layer.

6. The semiconductor memory device according to claim 1, further comprising:
a first conductive layer provided above the memory cell array in the first direction and opposite to the substrate along the first direction, the first conductive layer extending in the second direction and being electrically coupled to the memory cells,
wherein the second peripheral circuit is arranged below the first conductive layer in the first direction in a vicinity of an end of the first conductive layer.

7. The semiconductor memory device according to claim 1, further comprising:
an input/output circuit provided on an end of the substrate in the second direction so as not to overlap the memory cell array when viewed along the first direction, the input/output circuit being configured to input and output data to and from the memory cells; and
a sequencer provided between the substrate and the memory cell array and configured to control the sense amplifier, the first peripheral circuit, and the second peripheral circuit,
wherein the sequencer is separated from the input/output circuit, and overlaps the memory cell array when viewed along the first direction.

8. The semiconductor memory device according to claim 7, further comprising:
a capacitor provided between the substrate and the memory cell array and electrically coupled to an interconnect of a power supply in the input/output circuit,
wherein the capacitor overlaps the memory cell array when viewed along the first direction.

9. The semiconductor memory device according to claim 1, further comprising:
a third peripheral circuit provided on an end of the substrate in the second direction so as not to overlap the memory cell array when viewed along the first direction, the third peripheral circuit extending in a third direction which intersects the first direction and the second direction,
wherein the third peripheral circuit includes:
an input/output circuit provided at a center of the third peripheral circuit in the third direction, the input/output circuit being configured to input and output data to and from the memory cells; and
a power supply circuit outside the center of the third peripheral circuit in the third direction.

10. The semiconductor memory device according to claim 1, further comprising:
a plurality of conductive layers stacked on the substrate in the first direction; and
a pillar passing through the conductive layers in the first direction and including a semiconductor layer,
wherein intersections of the pillar and the conductive layers function as the memory cells.

11. The semiconductor memory device according to claim 1, further comprising:

a plurality of first conductive layers stacked on the substrate in the first direction;

a plurality of second conductive layers stacked on the substrate in the first direction, the plurality of second conductive layer being provided apart from the first conductive layers in a third direction which intersects the first direction and the second direction;

a first pillar passing through the first conductive layers in the first direction and including a semiconductor layer;

a second pillar passing through the second conductive layers in the first direction and including a semiconductor layer; and a switch circuit provided between the first conductive layers and the second conductive layers, the switch circuit electrically coupling the first conductive layers and the second conductive layers to the first peripheral circuit, wherein intersections of the first pillar and the first conductive layers and intersections of the second pillar and the second conductive layers function as the memory cells.

12. The semiconductor memory device according to claim 1, wherein the sense amplifier has a finer design rule than the first peripheral circuit and the second peripheral circuit.

13. The semiconductor memory device according to claim 1, further comprising:

a third peripheral circuit provided on an end of the substrate in the second direction so as not to overlap the memory cell array when viewed along the first direction, the third peripheral circuit extending in a third direction which intersects the first direction and the second direction, wherein the third peripheral circuit is in contact with the second peripheral circuit.

* * * * *